United States Patent
Jonishi

(10) Patent No.: US 11,626,878 B2
(45) Date of Patent: Apr. 11, 2023

(54) SEMICONDUCTOR DEVICE

(71) Applicant: FUJI ELECTRIC CO., LTD., Kawasaki (JP)

(72) Inventor: Akihiro Jonishi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/562,374

(22) Filed: Dec. 27, 2021

(65) Prior Publication Data
US 2022/0247410 A1    Aug. 4, 2022

(30) Foreign Application Priority Data

Feb. 2, 2021 (JP) .............................. JP2021-014822

(51) Int. Cl.
*H03K 19/0185* (2006.01)
*H01L 29/78* (2006.01)

(52) U.S. Cl.
CPC .. *H03K 19/018507* (2013.01); *H01L 29/7819* (2013.01)

(58) Field of Classification Search
CPC ... H03K 19/018507; H03K 2217/0081; H03K 2217/0072; H03K 17/16; H03K 17/162; H03K 3/037; H03K 19/0185; H03K 17/161; H03K 19/0175; H03K 19/017509; H03K 17/6871; H03K 17/691; H03K 17/08122; H03K 17/18; H03K 17/102; H03K 19/20; H03K 17/04123; H03K 2217/0063; H03K 17/687; H01L 29/7819; H01L 21/761; H01L 29/7393; H02M 1/088; H02M 7/003; H02M 7/537
See application file for complete search history.

(56) References Cited

U.S. PATENT DOCUMENTS

| | | | |
|---|---|---|---|
| 5,801,418 A | 9/1998 | Ranjan | |
| 9,136,326 B2 | 9/2015 | Yamaji | |
| 2014/0197491 A1 | 7/2014 | Yamaji | |
| 2017/0237362 A1* | 8/2017 | Sasaki | H02M 1/32 363/98 |

FOREIGN PATENT DOCUMENTS

| | | | | |
|---|---|---|---|---|
| JP | 3214818 B2 | 10/2001 | | |
| JP | 2014138091 A | 7/2014 | | |
| JP | 6798377 B2 * | 12/2020 | ........... | H01L 21/761 |

OTHER PUBLICATIONS

Yamazaki et al., "New high voltage integrated circuits using self-shielding technique", Proc. of the 11th Int. Symp. on Power Semiconductor Devices and ICs IEEE and IEEJ, 1999, pp. 333-336.

\* cited by examiner

*Primary Examiner* — John W Poos
*Assistant Examiner* — Tyler J Pereny

(57) ABSTRACT

A semiconductor device includes: a pad; a control circuit; a plurality of high-potential-side circuit regions having distances to the pad different from each other, each including a gate drive circuit, a SET-side level shifter, a RESET-side level shifter, and a circular wire; a SET-side wire electrically connects the pad with the SET-side level shifters; and a RESET-side wire electrically connects the pad with the RESET-side level shifters, wherein the circular wire located closer to the pad is electrically connected to the SET-side wire and the RESET-side wire via the circular wire 8u located further from the pad.

16 Claims, 24 Drawing Sheets

FIG. 6

| STATE | LEVEL SHIFTER | | GATE DRIVE OUTPUT |
|---|---|---|---|
| | SET SIDE | RESET SIDE | |
| A | OFF | OFF | CONSTANT |
| B | OFF | ON | TURN ON |
| C | ON | OFF | TURN ON |
| D | ON | ON | CONSTANT |

FIG. 20

| | | GND PAD LEVEL SHIFTER WIRING RESISTANCE | | | RESET-SIDE SOURCE VOLTAGE DROP SET-SIDE SOURCE VOLTAGE DROP WHEN ΔVrst = 1.5V | DIFFERENCE IN SOURCE VOLTAGE DROP |
|---|---|---|---|---|---|---|
| | | RESET SIDE | SET SIDE | RESISTANCE RATIO | | |
| | | Rrst [Ω] | Rset [Ω] | Rrst/Rset | ΔVset [V] | ΔVrst - ΔVset [V] |
| CONVENTIONAL STRUCTURE | U PHASE | 0.883 | 0.880 | 1.004 | 1.495 | 0.005 |
| | V PHASE | 0.714 | 0.699 | 1.021 | 1.469 | 0.031 |
| | W PHASE | 0.571 | 0.508 | 1.126 | 1.332 | 0.168 |
| PRESENT INVENTION | U PHASE | 1.305 | 1.275 | 1.024 | 1.466 | 0.034 |
| | V PHASE | 1.457 | 1.451 | 1.004 | 1.493 | 0.007 |
| | W PHASE | 1.632 | 1.631 | 1.001 | 1.498 | 0.002 |

SEMICONDUCTOR DEVICE

CROSS-REFERENCE TO RELATED APPLICATION

This applications claims benefit of priority under 35 USC 119 based on Japanese Patent Application No. 2021-14822 filed on Feb. 2, 2021, the entire contents of which are incorporated by reference herein.

BACKGROUND

1. Field of the Invention

The present invention relates to a semiconductor device such as a high-voltage integrated circuit (HVIC).

2. Description of the Related Art

Conventional insulated gate bipolar transistors (IGBTs) implementing bridge circuits for power conversion typically use transformers or photocouplers for electrical isolation so as to drive gates in semiconductor power switching elements. For the use of a device mainly with a small capacity, a high-voltage integrated circuit (referred to below as a "HVIC") has become popular that does not use electrical isolation so as to reduce costs. Such a HVIC is disclosed in JP 3214818 B (Patent Literature 1), JP 2014-138091 A (Patent Literature 2), and Proceeding of the 11th International Symposium on Power Semiconductor Devices and ICs, IEEE and IEEE, 1999, pp. 333-336 (Non-Patent Literature 1).

The HVIC includes a gate drive circuit that drives a gate of a semiconductor power switching element, a control circuit that controls the gate drive circuit, and a level shifter that transmits signals between the control circuit and the gate drive circuit. The control circuit operates at a ground potential (GND potential) as a reference potential. The gate drive circuit operates at a VS potential that is a floating potential as a reference potential. The gate drive circuit and the control circuit are isolated from each other by a high-voltage junction termination (HVJT). The HVJT is implemented by a high-voltage diode including a cathode on the gate drive circuit side (the VS terminal side) and an anode on the control circuit side (the GND terminal side).

The level shifter is implemented by a high-voltage n-channel MOSFET, for example. Two level shifters are installed on the SET side and on the RESET side, and are integrated with the HVJT. The respective sources of the SET-side level shifter and the RESET-side level shifter are connected to a GND pad via two wires of a SET-side wire and a RESET-side wire.

The HVICs disclosed in Patent Literature 1, Patent Literature 2 and Non-Patent Literature 1 each cause negative voltage noise called −Vs noise at the VS terminal in association with the switching operation of the semiconductor power switching element.

The GND pad is not necessarily arranged at a symmetrical position with respect to the SET-side level shifter and the RESET-side level shifter for reasons of packaging or layout of the control circuit, and a difference is caused between a wiring resistance between the source of the SET-side level shifter and the GND pad and a wiring resistance between the source of the RESET-side level shifter and the GND pad.

Such a difference further causes false turn-on only in either the SET-side level shifter or the RESET-side level shifter upon the generation of the negative voltage noise, which may lead to a wrong inversion of the output of the gate drive circuit.

SUMMARY

In view of the foregoing problems, the present invention provides a semiconductor device capable of preventing a wrong operation of a gate drive circuit caused by negative voltage noise.

An aspect of the present invention inheres in a semiconductor device including: a pad; a control circuit configured to operate at a first potential as a reference potential applied to the pad; a plurality of high-potential-side circuit regions having distances to the pad different from each other, each high-potential-side circuit region including a gate drive circuit configured to operate at a second potential that is a floating potential as a reference potential, a SET-side level shifter configured to convert a SET signal based on the first potential to a SET signal based on the second potential, and a RESET-side level shifter configured to convert a RESET signal based on the first potential to a RESET signal based on the second potential; a SET-side wire configured to electrically connect the pad with the SET-side level shifter of the high-potential-side circuit region located furthest from the pad; and a RESET-side wire configured to electrically connect the pad with the RESET-side level shifter of the high-potential-side circuit region located furthest from the pad; and wherein the SET-side level shifters of the high-potential-side circuit regions located closer to the pad than the high-potential-side circuit region located furthest from the pad are electrically connected to the pad via the SET-side wire, and the RESET-side level shifters of the high-potential-side circuit regions located closer to the pad than the high-potential-side circuit region located furthest from the pad are electrically connected to the pad via the RESET-side wire.

Another aspect of the present invention inheres in a semiconductor device including: a pad; a control circuit configured to operate at a first potential as a reference potential applied to the pad; a plurality of high-potential-side circuit regions having distances to the pad different from each other, each high-potential-side circuit region including a gate drive circuit configured to operate at a second potential that is a floating potential as a reference potential, a SET-side level shifter configured to convert a SET signal based on the first potential to a SET signal based on the second potential, a RESET-side level shifter configured to convert a RESET signal based on the first potential to a RESET signal based on the second potential, and a circular wire connected to the SET-side level shifter and the RESET-side level shifter; a SET-side wire configured to electrically connect the pad with the respective SET-side level shifters of the plural high-potential-side circuit regions; and a RESET-side wire configured to electrically connect the pad with the respective RESET-side level shifters of the plural high-potential-side circuit regions, wherein the circular wire of the high-potential-side circuit region located closer to the pad is electrically connected to the SET-side wire and the RESET-side wire via the circular wire of the high-potential-side circuit region located further from the pad.

BRIEF DESCRIPTION OF THE DRAWINGS

FIG. 6 is a table showing a relationship between a state of a level shifter and a gate drive output;

FIG. 20 is a table showing GND wiring resistance in the semiconductor device in each of the embodiment of the present invention and the comparative example;

DETAILED DESCRIPTION

Figure 1:
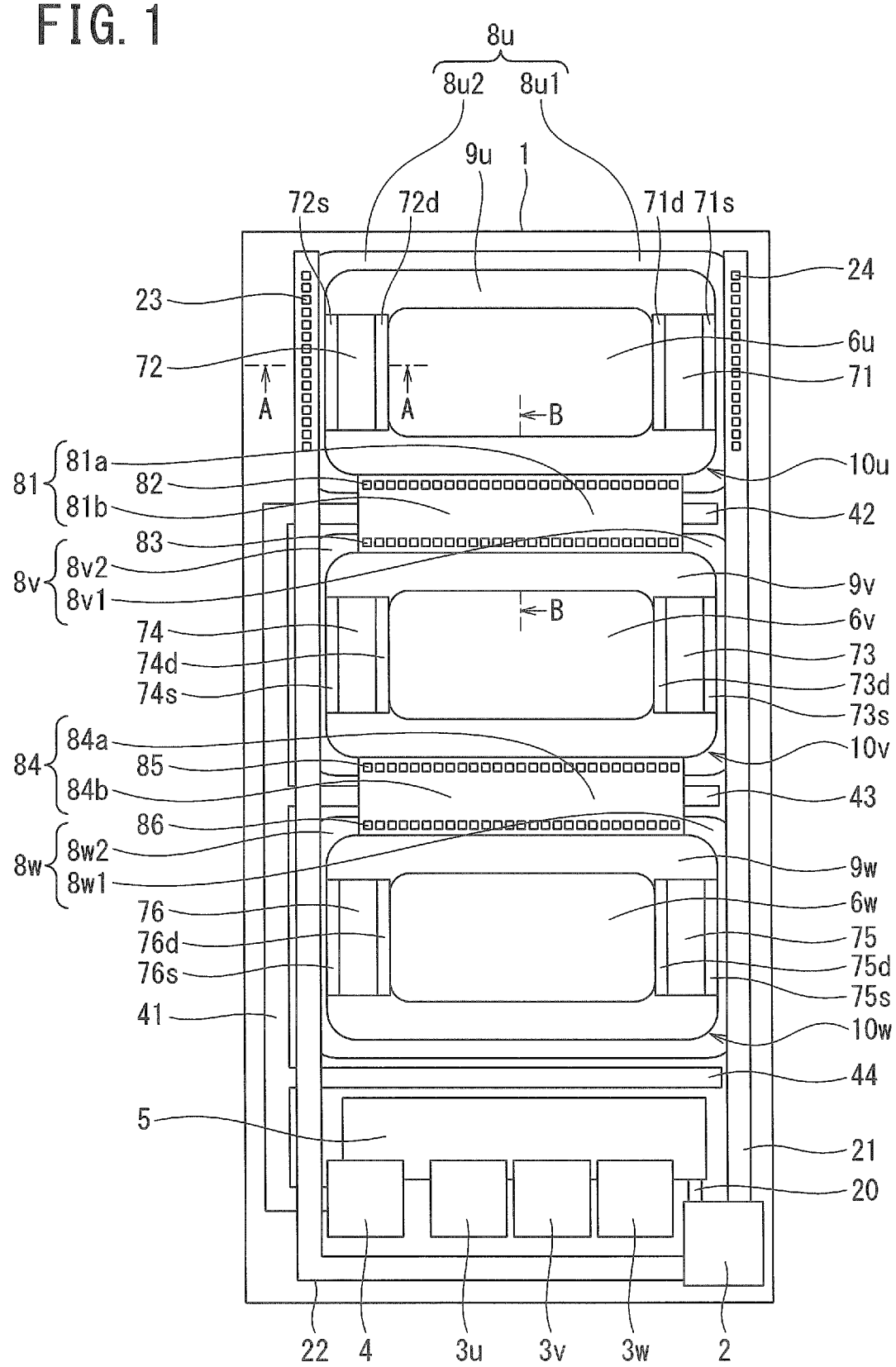
FIG. 1 is a plan view illustrating a semiconductor device according to an embodiment of the present invention.

With reference to the Drawings, an embodiment and modified examples of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiment and modified examples described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a field-effect transistor (FET) or a static induction transistor (SIT), an emitter region in an insulated-gate bipolar transistor (IGBT), and an anode region in a static induction (SI) thyristor or a gate turn-off (GTO) thyristor.

A "carrier reception region" means a semiconductor region which receive the majority carriers as the main current. The carrier reception region is assigned to a semiconductor region which will be the drain region in the FET or the SIT, the collector region in the IGBT, and the cathode region in the SI thyristor or GTO thyristor. A "control electrode" has a function of controlling the main current flowing between the carrier supply region and the carrier reception region. The control electrode is assigned to a gate electrode of the FET, SIT, IGBT, SI thyristor or GTO thyristor.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is a p-type and a second conductivity-type is an n-type. However, the relationship of the conductivity-types may be inverted to set the first conductivity-type to the n-type and the second conductivity-type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, the members and the regions that are limited by adding "first conductivity-type" and "second conductivity-type" in the following description indicate the members and the regions formed of semiconductor materials without particular obvious limitations.

Embodiment

<Configuration of Semiconductor Device>

A semiconductor device according to an embodiment of the present invention is illustrated with a HVIC that drives a three-phase inverter. The semiconductor device according to the embodiment of the present invention includes high-potential-side circuit regions 10u, 10v, and 10w of a plurality of phases (three phases) including a U-phase, a V-phase, and a W-phase on the same semiconductor substrate (semiconductor chip) 1, and a control circuit 5 as a low-potential-side circuit region, as illustrated in FIG. 1. The semiconductor substrate 1 to be used is a silicon (Si) substrate, for example.

The high-potential-side circuit regions 10u, 10v, and 10w of the U-phase, the V-phase, and the W-phase are arranged in line in the upper-lower direction in FIG. 1. The high-potential-side circuit region 10u of the U-phase includes a gate drive circuit 6u, a circular high-voltage junction termination region (HVJT) 9u provided at the circumference of the gate drive circuit 6u, and a circular wiring layer (a circular wire) 8u provided at the circumference of the HVJT 9u. The gate drive circuit 6u operates at a VS potential that is a floating potential as a reference potential. The circular wire 8u is arranged such that a first wire 8u1 electrically connected to a SET-side level shifter 71 and a second wire 8u2 electrically connected to a RESET-side level shifter 72 are connected to each other to surround the gate drive circuit 6u.

The high-potential-side circuit region 10u of the U-phase includes the level shifter for SET-signal transmission (the SET-side level shifter) 71 and the level shifter for RESET-signal transmission (the RESET-side level shifter) 72 arranged to be integrated with the HVJT 9u at the circumference of the gate drive circuit 6u. The two level shifters of the SET-side level shifter 71 and the RESET-side level shifter 72 are used to execute the signal transmission in a two-input mode using a SET signal and a RESET signal. The SET-side level shifter 71 and the RESET-side level shifter 72 are each implemented by a high-voltage n-channel MOSFET, for example. A carrier supply region (a source region) 71s of the SET-side level shifter 71 and a source region 72s of the RESET-side level shifter 72 are connected to the circular wire 8u. A carrier reception region (a drain region) 71d of the SET-side level shifter 71 and a drain region 72d of the RESET-side level shifter 72 are connected to the gate drive circuit 6u.

The high-potential-side circuit region 10v of the V-phase includes a gate drive circuit 6v, a circular HVJT 9v provided at the circumference of the gate drive circuit 6v, and a circular wiring layer (a circular wire) 8v provided at the circumference of the HVJT 9v. The gate drive circuit 6v operates at the VS potential that is a floating potential as a reference potential. The circular wire 8v is arranged such that a first wire 8v1 electrically connected to a SET-side level shifter 73 and a second wire 8v2 electrically connected to a RESET-side level shifter 74 are connected to each other to surround the gate drive circuit 6v.

The high-potential-side circuit region 10v of the V-phase includes the SET-side level shifter 73 and the RESET-side level shifter 74 arranged to be integrated with the HVJT 9v at the circumference of the gate drive circuit 6v. The SET-side level shifter 73 and the RESET-side level shifter 74 are each implemented by a high-voltage n-channel MOSFET, for example. A source region 73s of the SET-side level shifter 73 and a source region 74s of the RESET-side level shifter 74 are connected to the circular wire 8v. A drain region 73d of the SET-side level shifter 73 and a drain region 74d of the RESET-side level shifter 74 are connected to the gate drive circuit 6v.

The high-potential-side circuit region 10w of the W-phase includes a gate drive circuit 6w, a circular HVJT 9w provided at the circumference of the gate drive circuit 6w, and a circular wiring layer (a circular wire) 8w provided at the circumference of the HVJT 9w. The gate drive circuit 6w operates at the VS potential that is a floating potential as a reference potential. The circular wire 8w is arranged such that a first wire 8w1 electrically connected to a SET-side level shifter 75 and a second wire 8w2 electrically connected to a RESET-side level shifter 76 are connected to each other to surround the gate drive circuit 6w.

The high-potential-side circuit region 10w of the W-phase includes the SET-side level shifter 75 and the RESET-side level shifter 76 arranged to be integrated with the HVJT 9w at the circumference of the gate drive circuit 6w. The SET-side level shifter 75 and the RESET-side level shifter 76 are each implemented by a high-voltage n-channel MOSFET, for example. A source region 75s of the SET-side level shifter 75 and a source region 76s of the RESET-side level shifter 76 are connected to the circular wire 8w. A drain region 75d of the SET-side level shifter 75 and a drain region 76d of the RESET-side level shifter 76 are connected to the gate drive circuit 6w.

The control circuit 5 is arranged toward the high-potential-side circuit region 10w of the W-phase that is the end of the alignment of the high-potential-side circuit regions 10u, 10v, and 10w of the U-phase, the V-phase, and the W-phase. The control circuit 5 is located at a position closest to the high-potential-side circuit region 10w of the W-phase among the high-potential-side circuit regions 10u, 10v, and 10w of the U-phase, the V-phase, and the W-phase, and is located at a position furthest from the high-potential-side circuit region 10u of the U-phase. The control circuit 5 operates at a ground potential (a GND potential) as a reference potential, and controls the high-potential-side circuit regions 10u, 10v, and 10w of the U-phase, the V-phase, and the W-phase.

The circumference of the control circuit 5 is provided with a pad (a GND pad) 2 to which the GND potential that is a reference potential of the control circuit 5 is input, pads (HIN pads) 3u, 3v, and 3w to which input signals HIN(U), HIN(V), and HIN(W) transferred to the control circuit 5 are input, and a pad (a VCC pad) 4 electrically connected to a power supply of the control circuit 5 and to which the VCC potential that is a power supply potential of the control circuit 5 is input.

The GND pad 2 is located at a position closest to the high-potential-side circuit region 10w of the W-phase among the high-potential-side circuit regions 10u, 10v, and 10w of the U-phase, the V-phase, and the W-phase, and is located at a position furthest from the high-potential-side circuit region 10*u* of the U-phase. The GND pad 2 is arranged at the corner on the lower-right side of the planar pattern of the semiconductor substrate 1. The GND pad 2 is connected to the control circuit 5 via a wire 20. The GND pad 2 is connected with one end of a SET-side wire 21 and one end of a RESET-side wire 22. The SET-side wire 21 and the RESET-side wire 22 are arranged at a layer over the respective circular wires 8*u*, 8*v*, and 8*w*. The SET-side wire 21 has a straight pattern, and is arranged to extend along the right side of the semiconductor substrate 1. The other end of the SET-side wir 21 is electrically connected to the circular wire 8*u* located at a layer under the SET-side wire 21 via contacts 24.

The RESET-side wire 22 has an L-shaped pattern, and includes a part extending on the lower side of the semiconductor substrate 1 and a part extending on the left side of the semiconductor substrate 1. The other end of the RESET-side wire 22 is electrically connected to the circular wire 8*u* located at the layer under the RESET-side wire 22 via contacts 23. The RESET-side wire 22 has a greater length than the SET-side wire 21, since the GND pad 2 is arranged at the corner on the lower-right side of the planar pattern of the semiconductor substrate 1.

The source region 71*s* of the SET-side level shifter 71 of the U-phase is electrically connected to the GND pad 2 via the circular wire 8*u* and the SET-side wire 21. The source region 72*s* of the RESET-side level shifter 72 of the U-phase is electrically connected to the GND pad 2 via the circular wire 8*u* and the RESET-side wire 22. The SET-side wire 21 thus electrically connects the GND pad 2 with the SET-side level shifter 71 of the high-potential-side circuit region 10*u* located at the position furthest from the GND pad 2. The RESET-side wire 22 electrically connects the GND pad 2 with the RESET-side level shifter 72 of the high-potential-side circuit region 10*u* located at the position furthest from the GND pad 2.

A connection wire 81 is arranged at a layer over the circular wire 8*u* and the circular wire 8*v* so as to overlap with a region between the circular wire 8*u* of the U-phase and the circular wire 8*v* of the V-phase. The connection wire 81 is arranged at the same wiring layer as the SET-side wire 21 and the RESET-side wire 22, for example. The circular wire 8*u* is electrically connected to the connection wire 81 via contacts 82. The circular wire 8*v* is electrically connected to the connection wire 81 via contacts 83. A first connection wire 81*a* electrically connecting the respective first wires 8*u*1 and 8*v*1 of the high-potential-side circuit regions 10*u* and 10*v* of the U-phase and the V-phase is connected with a second connection wire 81*b* electrically connecting the respective second wires 8*u*2 and 8*v*2 of the high-potential-side circuit regions 10*u* and 10*v* of the U-phase and the V-phase so as to compose the connection wire 81.

The source region 73*s* of the SET-side level shifter 73 of the V-phase is electrically connected to the GND pad 2 via the circular wire 8*v*, the connection wire 81, the circular wire 8*u*, and the SET-side wire 21. The source region 74*s* of the RESET-side level shifter 74 of the V-phase is electrically connected to the GND pad 2 via the circular wire 8*v*, the connection wire 81, the circular wire 8*u*, and the RESET-side wire 22.

A connection wire 84 is arranged at a layer over the circular wire 8*v* and the circular wire 8*w* so as to overlap with a region between the circular wire 8*v* of the V-phase and the circular wire 8*w* of the W-phase. The connection wire 84 is arranged at the same wiring layer as the SET-side wire 21 and the RESET-side wire 22, for example. The circular wire 8*v* is electrically connected to the connection wire 84 via contacts 85. The circular wire 8*w* is electrically connected to the connection wire 84 via contacts 86. A first connection wire 84*a* electrically connecting the respective first wires 8*v*1 and 8*w*1 of the high-potential-side circuit regions 10*v* and 10*w* of the V-phase and the W-phase is connected with a second connection wire 84*b* electrically connecting the respective second wires 8*v*2 and 8*w*2 of the high-potential-side circuit regions 10*v* and 10*w* of the V-phase and the W-phase so as to compose the connection wire 84.

The source region 75*s* of the SET-side level shifter 75 of the W-phase is electrically connected to the GND pad 2 via the circular wire 8*w*, the connection wire 84, the circular wire 8*v*, the connection wire 81, the circular wire 8*u*, and the SET-side wire 21. The source region 76*s* of the RESET-side level shifter 76 of the W-phase is electrically connected to the GND pad 2 via the circular wire 8*w*, the connection wire 84, the circular wire 8*v*, the connection wire 81, the circular wire 8*u*, and the RESET-side wire 22.

The semiconductor device according to the embodiment of the present invention thus has the configuration in which the circular wire 8*w* located closer to the GND pad 2 is electrically connected to the GND pad 2 via the circular wire 8*u* of the U-phase and the circular wire 8*v* of the V-phase located further from the GND pad 2. The circular wire 8*v* of the V-phase located closer to the GND pad 2 is electrically connected to the GND pad 2 via the circular wire 8*u* of the U-phase located further from the GND pad 2. The SET-side level shifters 73 and 75 of the high-potential-side circuit regions 10*v* and 10*w* located closer to the GND pad 2 than the high-potential-side circuit region 10*u* located furthest from the GND pad 2 are electrically connected to the GND pad 2 via the SET-side wire 21. The RESET-side level shifters 74 and 76 of the high-potential-side circuit regions 10*v* and 10*w* located closer to the GND pad 2 than the high-potential-side circuit region 10*u* located furthest from the GND pad 2 are electrically connected to the GND pad 2 via the RESET-side wire 22.

Figure 2:
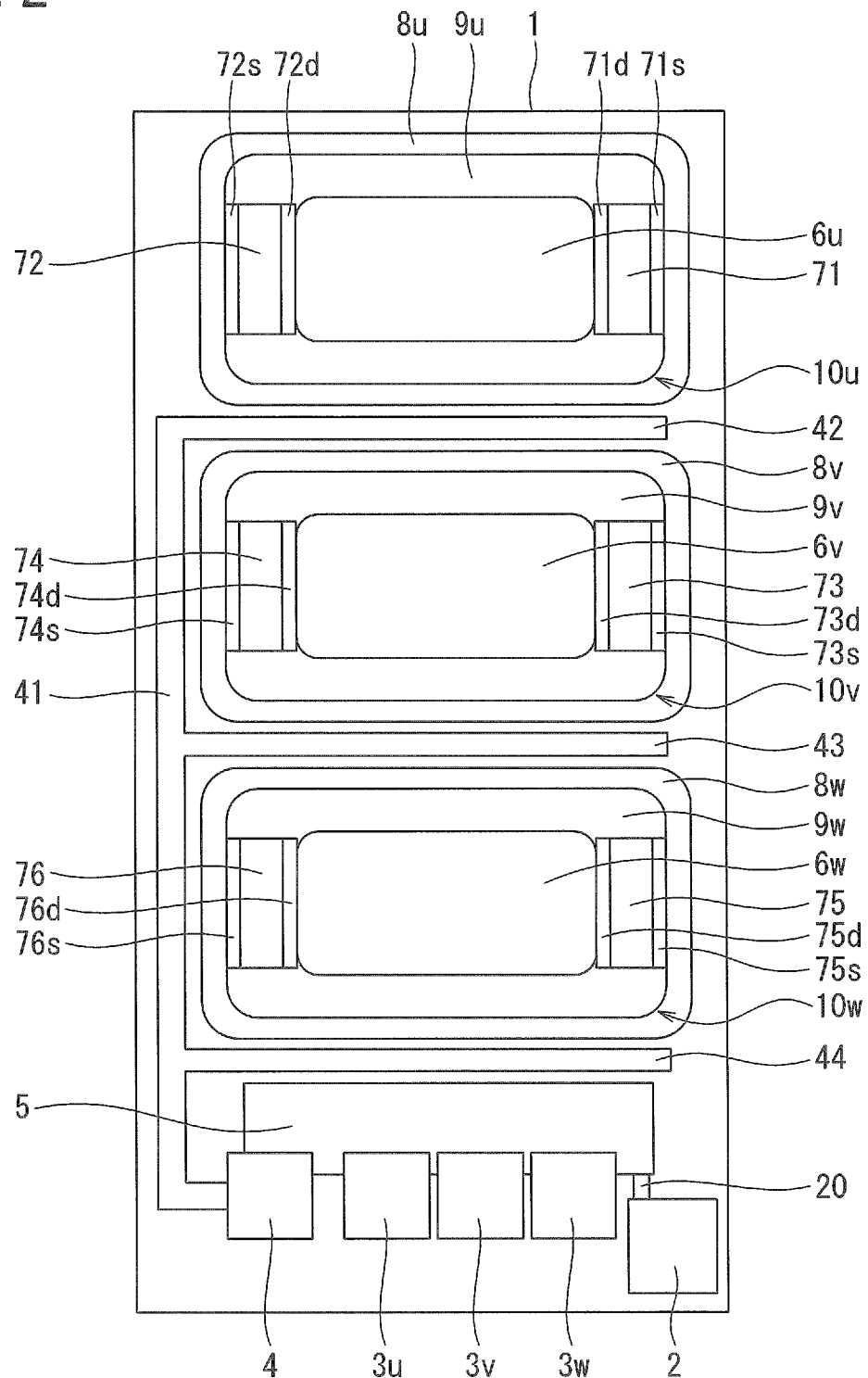
FIG. 2 is a plan view omitting a part of the semiconductor device according to the embodiment of the present invention.

FIG. 2 illustrates a planar layout in which the SET-side wire 21, the RESET-side wire 22, the connection wire 81, and the connection wire 84 located at the upper layer illustrated in FIG. 1 including the respective contacts 23, 24, 82, 83, 85, and 86 are omitted. One end of a VCC wire 41 is connected to the VCC pad 4. The VCC wire 41 is arranged at a layer under the SET-side wire 21, the RESET-side wire 22, the connection wire 81, and the connection wire 84 illustrated in FIG. 1. The VCC wire 41 has an L-shaped planar pattern, and is arranged to extend on the left side of the semiconductor substrate 1.

Three VCC wires 42, 43, and 44 are branched from the VCC wire 41. The VCC wire 42 is arranged to extend between the circular wire 8*u* of the U-phase and the circular wire 8*v* of the V-phase. The VCC wire 43 is arranged to extend between the circular wire 8*v* of the V-phase and the circular wire 8*w* of the W-phase. The VCC wire 44 is arranged to extend between the circular wire 8*w* of the W-phase and the control circuit 5. Although not illustrated in FIG. 2, a semiconductor region of n-type is provided in the semiconductor substrate 1 immediately under the respective VCC wires 42 to 44, and is connected to the VCC wires and fixed to the VCC potential. The arrangement of the n-type semiconductor region can prevent noise current that can cause damage or malfunction from flowing through the control circuit 5 or the high-potential-side circuit regions 10*u*, 10*v*, and 10*w* of the respective phases adjacent to each other if negative voltage noise is generated. The semiconductor device according to the embodiment of the present invention may be configured without the provision of the VCC wires 41 to 44.

Figure 3:
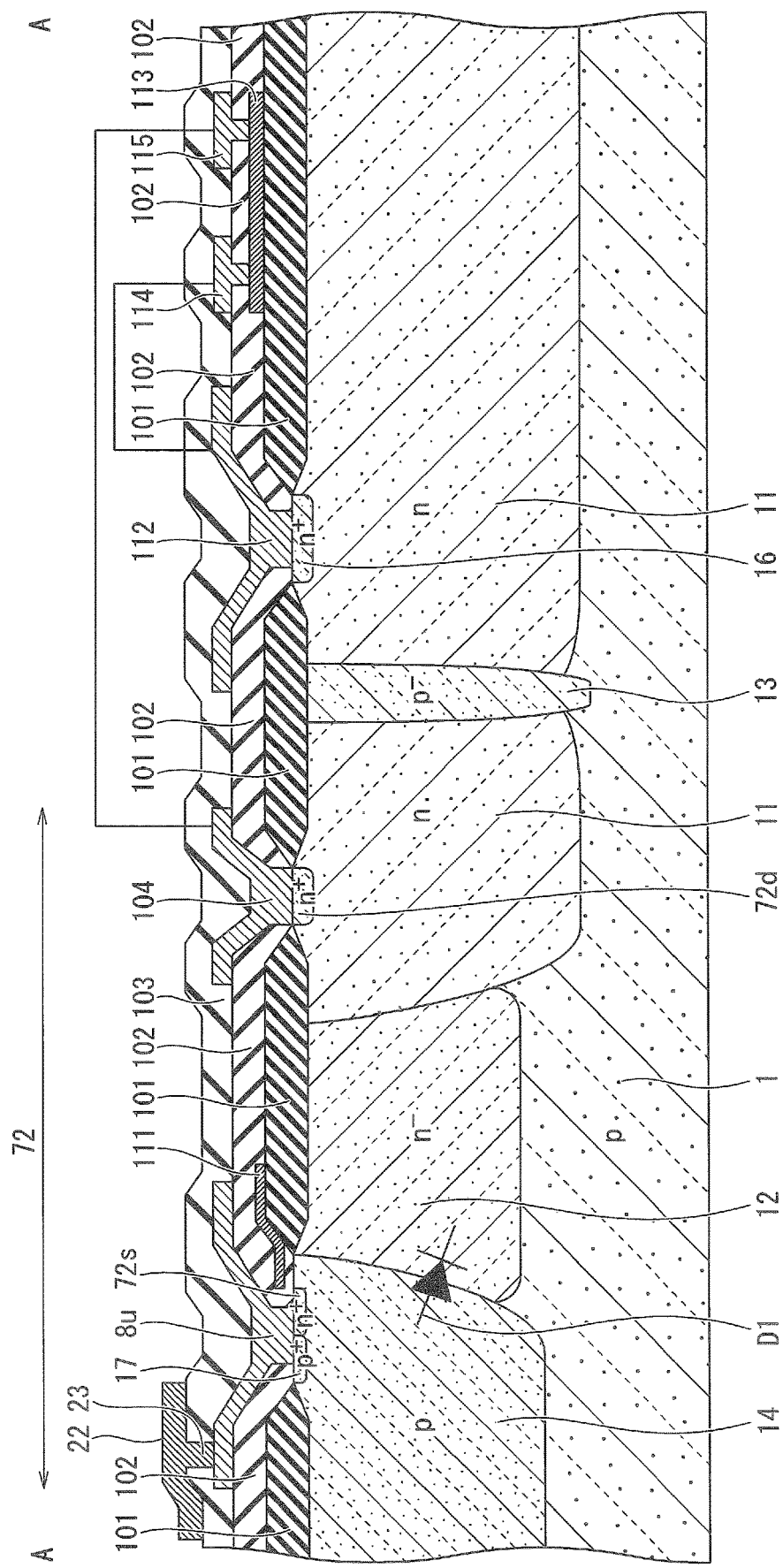
FIG. 3 is a cross-sectional view as viewed from direction A-A in FIG. 1.

FIG. 3 is a cross-sectional view as viewed from direction A-A including the RESET-side level shifter 72 illustrated in FIG. 1. As illustrated in FIG. 3, the semiconductor device according to the embodiment of the present invention includes a well region 11 of n-type provided at an upper part of the p-type semiconductor substrate 1. The n-type well region 11 is provided with a junction isolation region (a slit region) 13 of p-type. The p-type junction isolation region 13 has a depth penetrating the n-type well region 11 to reach the p-type semiconductor substrate 1, and leads the n-type well region 11 to be junction-isolated. A pickup region 16 of $n^+$-type is provided at an upper part of the n-type well region 11 on the inner side of the p-type junction isolation region 13. A pickup electrode 112 connected to a VB terminal as a high-potential-side power supply terminal of the gate drive circuit 6*u* is provided on the $n^+$-type pickup region 16.

A breakdown voltage region 12 of $n^-$-type having a lower impurity concentration than the n-type well region 11 is provided in contact with the n-type well region 11. A base region 14 of p-type is further provided in contact with the $n^-$-type breakdown voltage region 12. A contact region 17 of $p^+$-type having a higher impurity concentration than the p-type base region 14 is provided into a circular shape at an upper part of the p-type base region 14. Insulating films 101, 102, and 103 are deposited on the n-type well region 11, the $n^-$-type breakdown voltage region 12, and the p-type base region 14. As schematically illustrated in FIG. 3, a high-voltage diode D1 is provided due to the p-n junction between the $n^-$-type breakdown voltage region 12 and the p-type base region 14, and the HVJT 9*u* illustrated in FIG. 1 is implemented by the high-voltage diode D1.

The RESET-side level shifter 72 that is the high-voltage n-channel MOSFET uses the $n^-$-type breakdown voltage region 12 as a drift region. The RESET-side level shifter 72 includes the $n^+$-type source region 72*s* provided adjacent to the $p^+$-type contact region 17 at an upper part of the p-type base region 14. The circular wire 8*u* serving as a source electrode is provided on and in contact with the $p^+$-type contact region 17 and the $n^+$-type source region 72*s*. The RESET-side wire 22 is connected to the circular wire 8*u* via the contacts 23.

The RESET-side level shifter 72 includes the $n^+$-type drain region 72*d* provided at an upper part of the n-type well region 11. A drain electrode 104 is provided on and in contact with the $n^+$-type drain region 72*d*. A gate electrode 111 is provided on the p-type base region 14 between the circular wire 8*u* serving as the source electrode and the drain electrode 104 via a gate insulating film.

A level shift resistor 113 formed from polycrystalline silicon is provided on the n-type well region 11 via the insulating film 101. A first electrode 114 and a second electrode 115 are provided at both ends on the top surface side of the level shift resistor 113. While FIG. 3 indicates the electrical connection between the pickup electrode 112 and the first electrode 114 by the solid line for illustration purposes, the pickup electrode 112 and the first electrode 114 may be formed by wiring layers at the same layer or at different layers so as to be connected to each other through via holes. While FIG. 3 indicates the electrical connection between the drain electrode 104 and the second electrode 115 by the solid line for illustration purposes, the drain electrode 104 and the second electrode 115 may be formed by wiring layers at the same layer or at different layers so as to be connected to each other through via holes. The pickup electrode 112 is electrically connected to the drain region 72*d* of the RESET-side level shifter 72 via the level shift resistor 113. The SET-side level shifters 71, 73, and 75 and the RESET-side level shifters 74 and 76 illustrated in FIG. 1 each have the same structure as the RESET-side level shifter 72 illustrated in FIG. 3.

Figure 4:
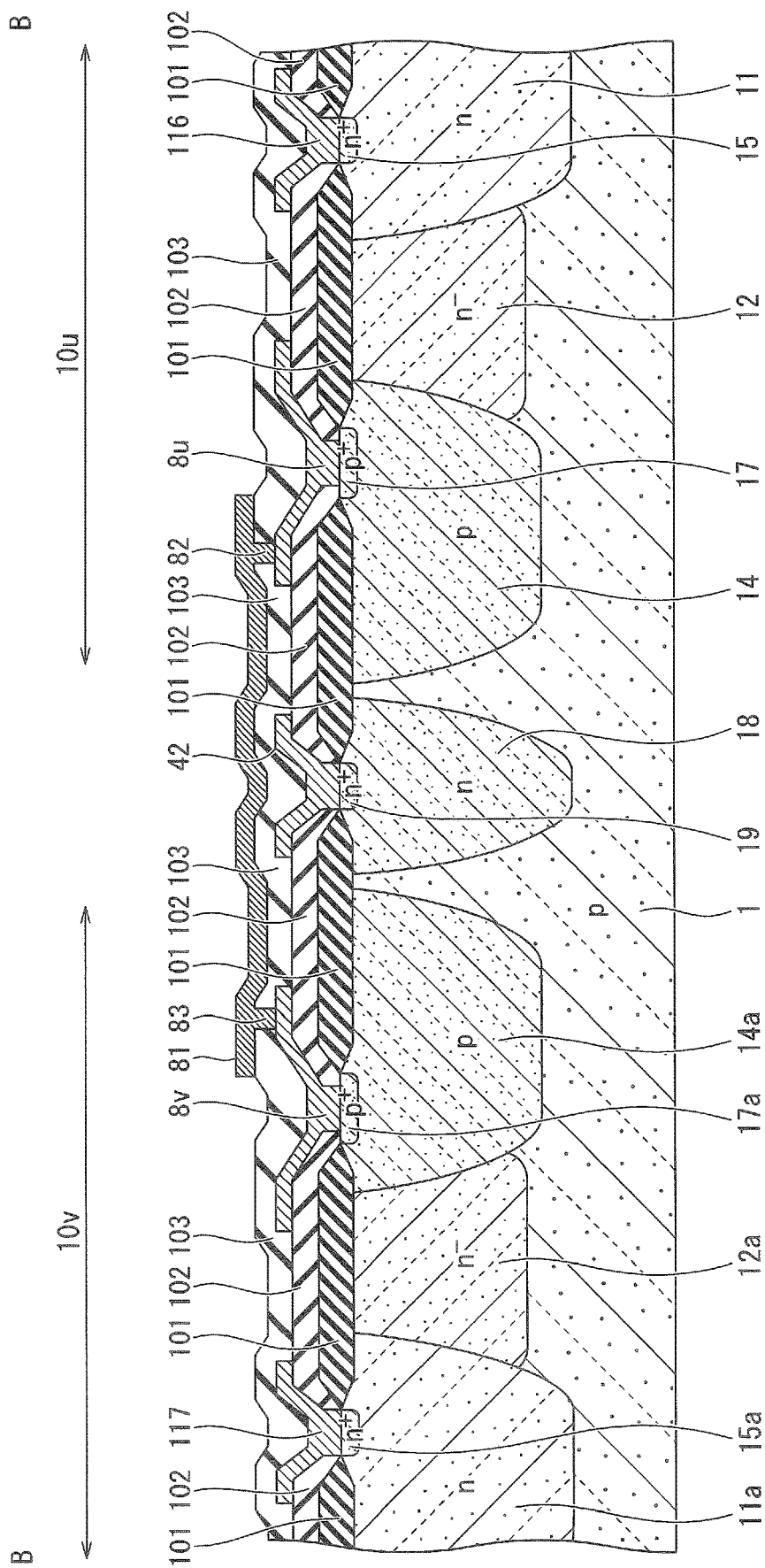
FIG. 4 is a cross-sectional view as viewed from direction B-B in FIG. 1.

FIG. 4 is a cross-sectional view as viewed from direction B-B including the connection wire 81 illustrated in FIG. 1. As illustrated on the right side in FIG. 4, the high-potential-side circuit region 10*u* includes the n-type well region 11 provided at the upper part of the p-type semiconductor substrate 1. A pickup region 15 of $n^+$-type is provided at an upper part of the n-type well region 11. A pickup electrode 116 connected to the VB terminal that is the high-potential-side power supply terminal of the gate drive circuit 6*u* is provided on the $n^+$-type pickup region 15.

The $n^-$-type breakdown voltage region 12 having a lower impurity concentration than the n-type well region 11 is provided in contact with the n-type well region 11. The p-type base region 14 is provided in contact with the $n^-$-type breakdown voltage region 12. The $p^+$-type contact region 17 having a higher impurity concentration than the p-type base region 14 is provided into a circular shape at an upper part of the p-type base region 14. The circular wire 8*u* is provided on and in contact with the $p^+$-type contact region 17.

As illustrated on the left side in FIG. 4, the high-potential-side circuit region 10*v* includes a well region 11*a* of n-type provided at an upper part of the p-type semiconductor substrate 1. A pickup region 15*a* of $n^+$-type is provided at an upper part of the n-type well region 11*a*. A pickup electrode 117 connected to the VB terminal that is the high-potential-side power supply terminal of the gate drive circuit 6*v* is provided on the $n^+$-type pickup region 15*a*.

A breakdown voltage region 12*a* of $n^-$-type having a lower impurity concentration than the n-type well region 11*a* is provided in contact with the n-type well region 11*a*. A base region 14*a* of p-type is provided in contact with the $n^-$-type breakdown voltage region 12*a*. A contact region 17*a* of $p^+$-type having a higher impurity concentration than the p-type base region 14*a* is provided into a circular shape at an upper part of the p-type base region 14*a*. The circular wire 8*v* is provided on and in contact with the $p^+$-type contact region 17*a*.

As illustrated in the middle in FIG. 4, a semiconductor region 18 of n-type is provided between the n-type well regions 11 and 11*a* at an upper part of the p-type semiconductor substrate 1. A contact region 19 of $n^+$-type having a higher impurity concentration than the n-type semiconductor region 18 is provided at an upper part of the n-type semiconductor region 18. The VCC wire 42 is provided on and in contact with the $n^+$-type contact region 19. The n-type semiconductor region 18 is fixed to the VCC potential via the VCC wire 42. The connection wire 81 is provided on the VCC wire 42 via the insulating film 103. One end of the connection wire 81 is connected to the circular wire 8*u* via the contacts 82, and the other end of the connection wire 81 is connected to the circular wire 8*v* via the contacts 83. The circumferential structure of the connection wire 84 illustrated in FIG. 1 is the same as that of the connection wire 81 illustrated in FIG. 4.

Figure 5:
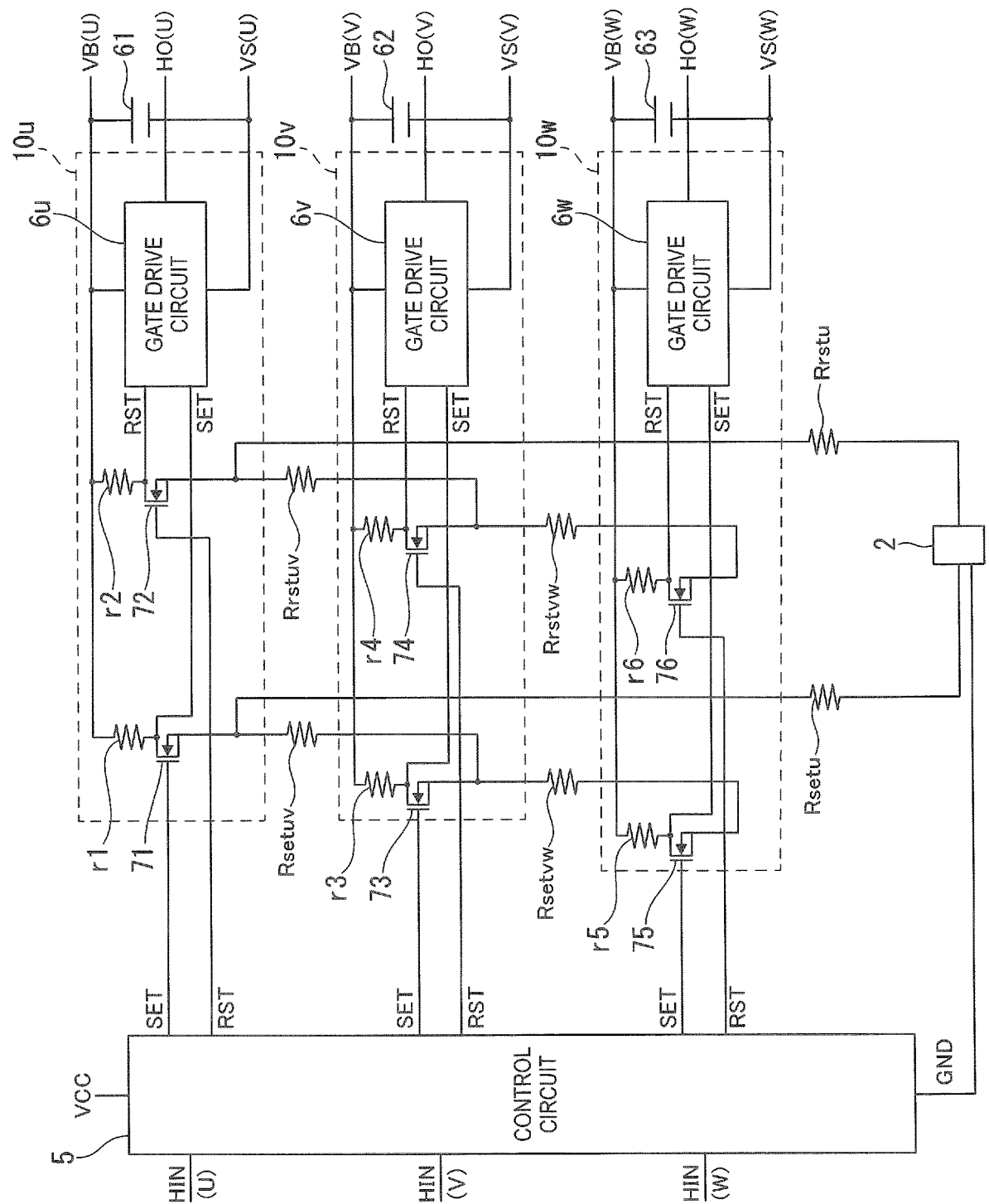
FIG. 5 is a circuit diagram of the semiconductor device according to the embodiment of the present invention.

FIG. 5 is an equivalent circuit diagram illustrating the semiconductor device according to the embodiment of the present invention. A gate of each of the SET-side level shifter 71 and the RESET-side level shifter 72 of the U-phase is connected to the control circuit 5. A level shift resistor r1 and the gate drive circuit 6*u* are connected to a drain of the SET-side level shifter 71. The GND pad 2 is connected to a source of the SET-side level shifter 71 via a wiring resistor Rsetu. A level shift resistor r2 and the gate drive circuit 6u are connected to a drain of the RESET-side level shifter 72. The GND pad 2 is connected to a source of the RESET-side level shifter 72 via a wiring resistor Rrstu. A power supply 61 on the high-potential (the VB potential) side is connected to the respective level shift resistors r1 and r2. The high-potential (the VB potential) side and the low-potential (the VS potential) side of the power supply 61 are connected to the gate drive circuit 6u.

A gate of each of the SET-side level shifter 73 and the RESET-side level shifter 74 of the V-phase is connected to the control circuit 5. A level shift resistor r3 and the gate drive circuit 6v are connected to a drain of the SET-side level shifter 73. The GND pad 2 is connected to a source of the SET-side level shifter 73 via wiring resistors Rsetuv and Rsetu. A level shift resistor r4 and the gate drive circuit 6v are connected to a drain of the RESET-side level shifter 74. The GND pad 2 is connected to a source of the RESET-side level shifter 74 via wiring resistors Rrstuv and Rrstu. A power supply 62 on the high-potential (the VB potential) side is connected to the respective level shift resistors r3 and r4. The high-potential (the VB potential) side and the low-potential (the VS potential) side of the power supply 62 are connected to the gate drive circuit 6v.

A gate of each of the SET-side level shifter 75 and the RESET-side level shifter 76 of the W-phase is connected to the control circuit 5. A level shift resistor r5 and the gate drive circuit 6w are connected to a drain of the SET-side level shifter 75. The GND pad 2 is connected to a source of the SET-side level shifter 75 via wiring resistors Rsetvw, Rsetuv, and Rsetu. A level shift resistor r6 and the gate drive circuit 6w are connected to a drain of the RESET-side level shifter 76. The GND pad 2 is connected to a source of the RESET-side level shifter 76 via wiring resistors Rrstvw, Rrstuv and Rrstu. A power supply 63 on the high-potential (the VB potential) side is connected to the respective level shift resistors r5 and r6. The high-potential (the VB potential) side and the low-potential (the VS potential) side of the power supply 63 are connected to the gate drive circuit 6w.

An example of switching operation of the semiconductor device according to the embodiment of the present invention is described below while focusing on the U-phase with reference to FIG. 5. When the input signal HIN(U) input to the control circuit 5 is changed from a low (L) level to a high (H) level, the control circuit 5 turns ON the SET-side level shifter 71 for a predetermined period of time, and transmits a SET signal SET based on the GND potential to the SET-side level shifter 71. The SET-side level shifter 71 converts the SET signal SET based on the GND potential transmitted from the control circuit 5 to a SET signal SET based on the VS potential that is the floating potential, and transmits the converted signal to the gate drive circuit 6u. The gate drive circuit 6u changes the output HO(U) of the gate drive circuit 6u from the L level to the H level in accordance with the SET signal SET based on the VS potential transmitted from the SET-side level shifter 71. The output HO(U) of the gate drive circuit 6u drives the gate of the semiconductor power switching element such as an IGBT. The semiconductor power switching element is an element arranged on the high-potential side of two elements connected in series between the power supply of the three-phase inverter and the ground.

When the input signal HIN(U) input to the control circuit 5 is changed from the H level to the L level, the control circuit 5 turns ON the RESET-side level shifter 72 for a predetermined period of time, and transmits a RESET signal RST based on the GND potential to the RESET-side level shifter 72. The RESET-side level shifter 72 converts the RESET signal RST based on the GND potential transmitted from the control circuit 5 to a RESET signal RST based on the VS potential, and transmits the converted signal to the gate drive circuit 6u. The gate drive circuit 6u changes the output HO(U) of the gate drive circuit 6u from the H level to the L level in accordance with the RESET signal RST based on the VS potential transmitted from the RESET-side level shifter 72. The switching operation of the V-phase and the W-phase is the same as that of the U-phase.

FIG. 6 is a table showing a relation between the states of the SET-side level shifters 71, 73, 75 and the RESET-side level shifters 72, 74, and 76 and the outputs of the gate drive circuits 6u, 6v, and 6w. State A refers to a case in which the SET-side level shifters 71, 73, 75 and the RESET-side level shifters 72, 74, and 76 are all in the OFF state, and the outputs of the gate drive circuits 6u, 6v, and 6w are constant. State B refers to a case in which the SET-side level shifters 71, 73, 75 are in the OFF state and the RESET-side level shifters 72, 74, and 76 are in the ON state, and the gate drive circuits 6u, 6v, and 6w are turned OFF. State C refers to a case in which the SET-side level shifters 71, 73, 75 are in the ON state and the RESET-side level shifters 72, 74, and 76 are in the OFF state, and the gate drive circuits 6u, 6v, and 6w are turned ON. State D refers to a case in which the SET-side level shifters 71, 73, 75 and the RESET-side level shifters 72, 74, and 76 are all in the ON state, and the outputs of the gate drive circuits 6u, 6v, and 6w are constant.

Comparative Example

Figure 7:
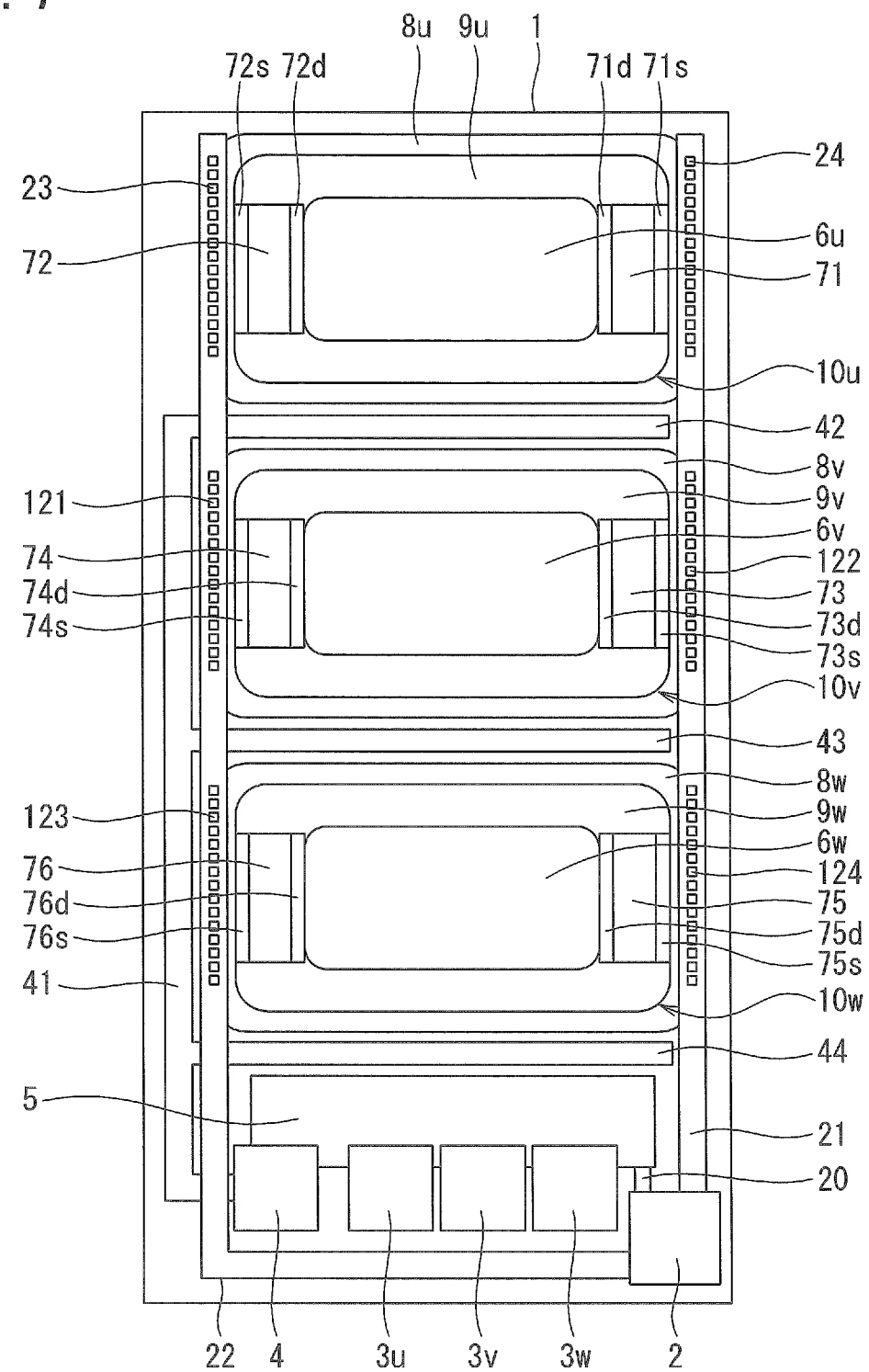
FIG. 7 is a plan view illustrating a semiconductor device of a comparative example.

A semiconductor device of a comparative example is described below. The semiconductor device of the comparative example differs from the semiconductor device according to the embodiment of the present invention illustrated in FIG. 1 in that the SET-side wire 21 is connected to the circular wires 8v and 8w via contacts 122 and 124, and the RESET-side wire 22 is connected to the circular wires 8v and 8w via contacts 121 and 123, as illustrated in FIG. 7. The semiconductor device of the comparative example further differs from the semiconductor device according to the embodiment of the present invention illustrated in FIG. 1 in not including the connection wires 81 and 84 for connecting the circular wires 8u, 8v, and 8w to each other.

Figure 8:
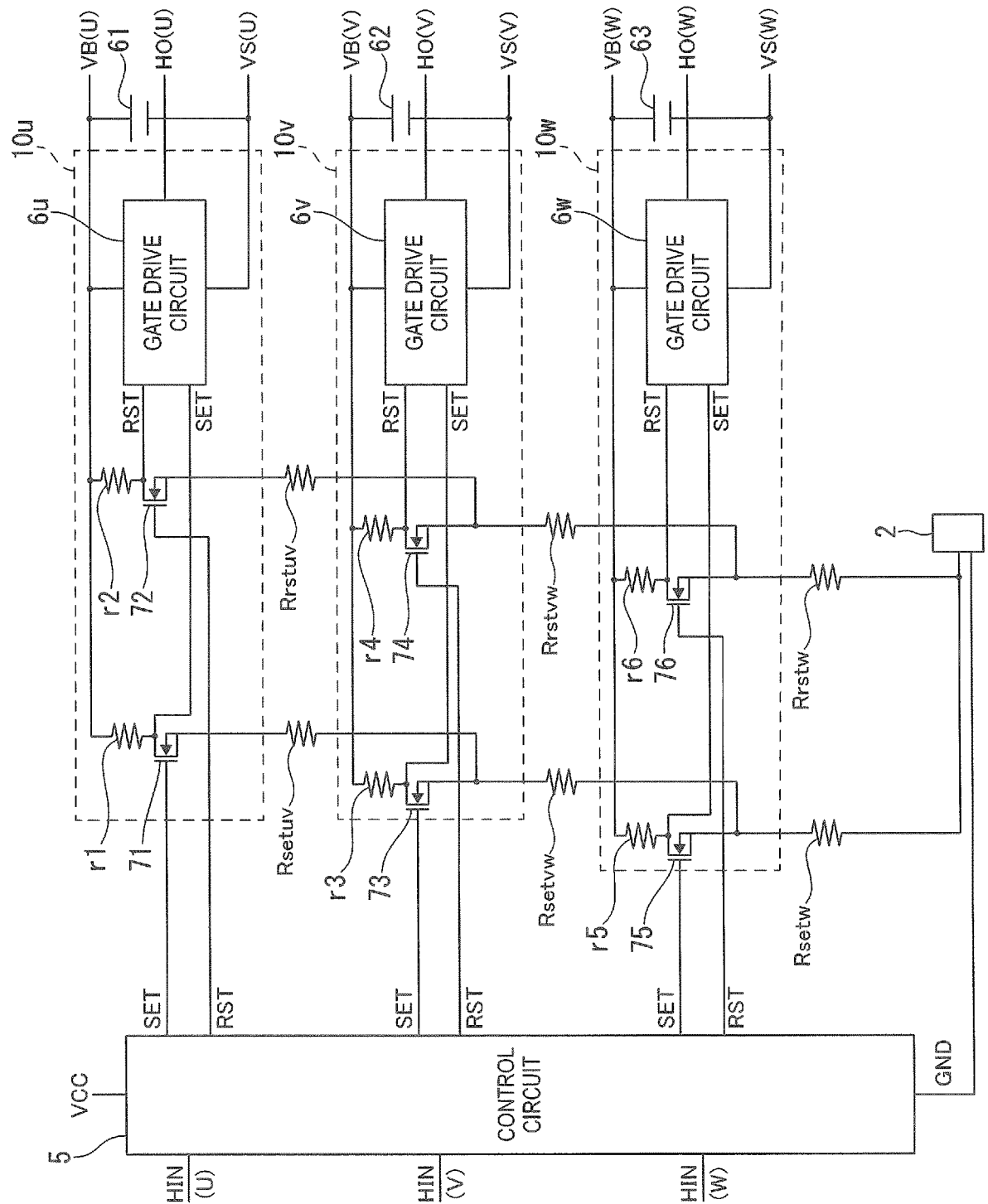
FIG. 8 is a circuit diagram of the semiconductor device of the comparative example.

FIG. 8 is an equivalent circuit diagram of the semiconductor device of the comparative example. In the semiconductor device of the comparative example, the source of the SET-side level shifter 75 of the W-phase is connected to the GND pad 2 via the wiring resistor Rsetw, and the source of the RESET-side level shifter 76 of the W-phase is connected to the GND pad 2 via the wiring resistor Rrstw. As illustrated in FIG. 7, since the respective lengths of the SET-side wire 21 and the RESET-side wire 22 from the GND pad 2 to each of the SET-side level shifter 75 and the RESET-side level shifter 76 of the W-phase differ from each other, the difference between the wiring resistors Rsetw and Rrstw illustrated in FIG. 8 increases.

The source of the SET-side level shifter 73 of the V-phase is connected to the GND pad 2 via the wiring resistors Rsetw and Rsetvw, and the source of the RESET-side level shifter 74 of the V-phase is connected to the GND pad 2 via the wiring resistors Rrstw and Rrstvw. The source of the SET-side level shifter 71 of the U-phase is connected to the GND pad 2 via the wiring resistors Rsetw, Rsetvw, and Rsetuv, and the source of the RESET-side level shifter 72 of the U-phase is connected to the GND pad 2 via the wiring resistors Rrstw, Rrstvw, and Rrstuv.

Figure 9:
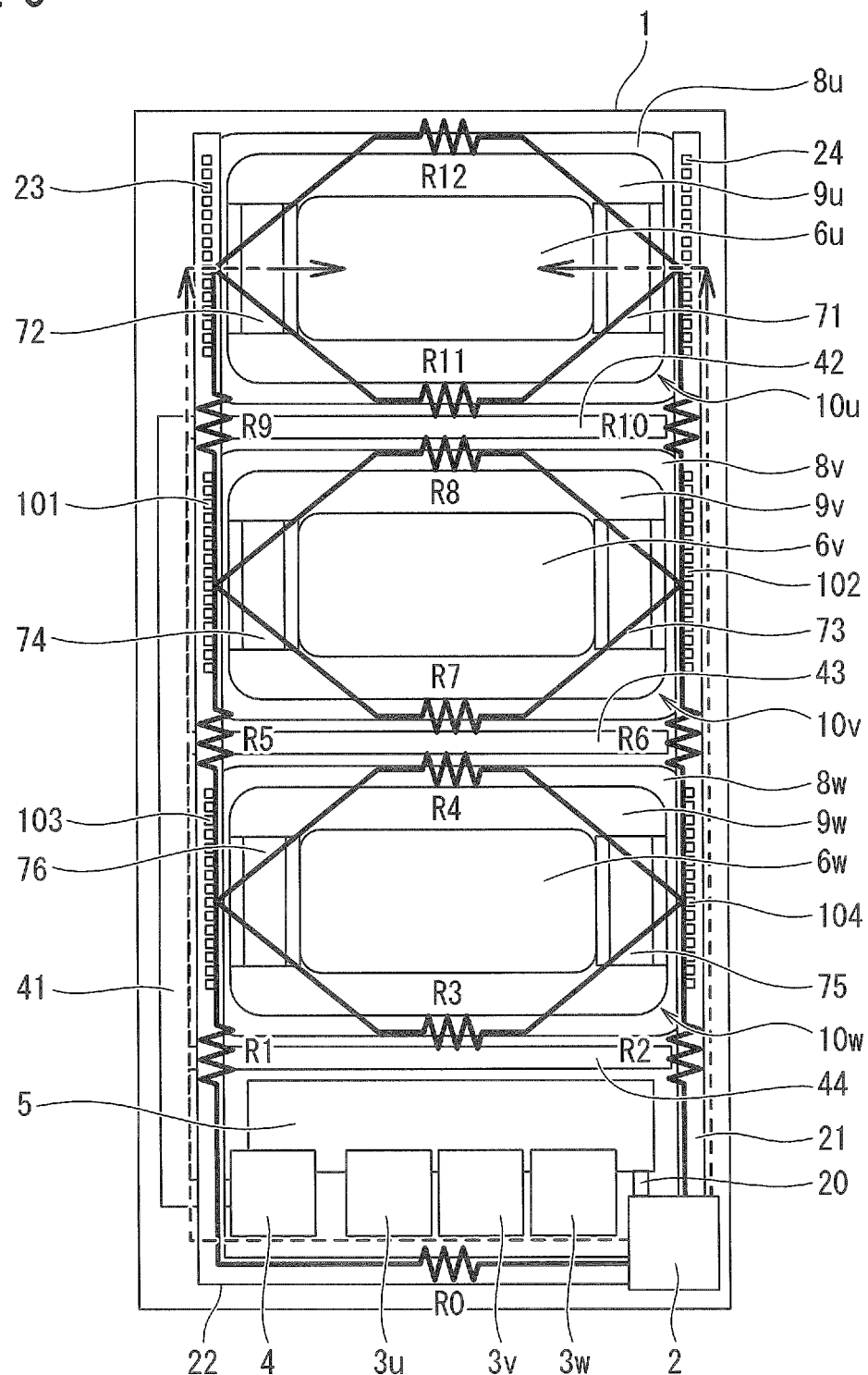
FIG. 9 is a plan view illustrating paths of a noise current upon generation of −Vs noise at a U-phase in the semiconductor device of the comparative example.
Figure 10:
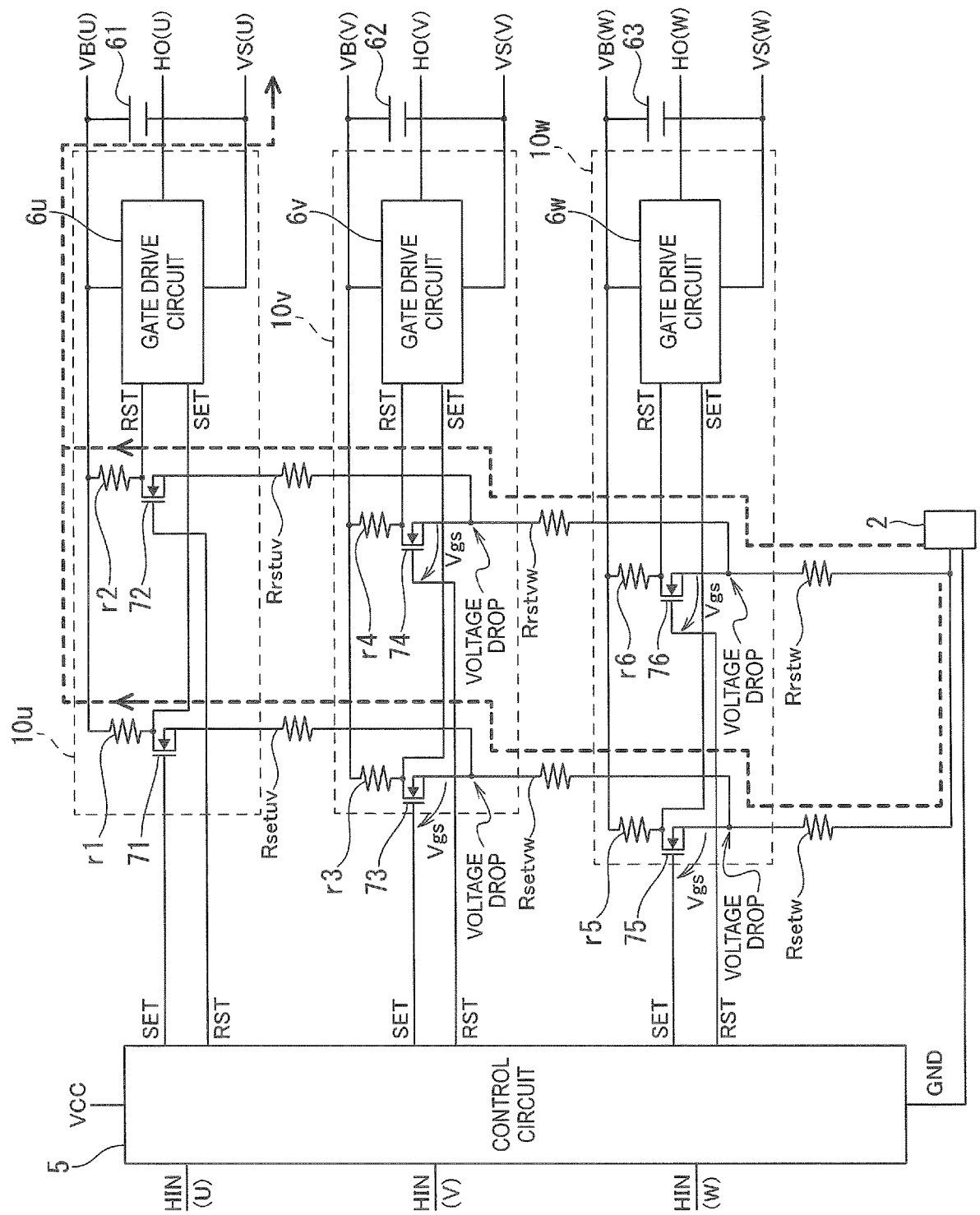
FIG. 10 is a circuit diagram illustrating the paths of the noise current upon the generation of the −Vs noise at the U-phase in the semiconductor device of the comparative example.

In the semiconductor device of the comparative example, noise of negative voltage called −Vs noise is generated at the VS terminal of the respective phases in association with the switching of the semiconductor power switching element. For example, as illustrated in FIG. 9 and FIG. 10, when the −Vs noise is generated at the U-phase, the high-voltage diode implementing the HVJT 9u of the U-phase is led to be in a forward-bias state, which causes a noise current to flow through the Vs terminal from the GND pad 2. FIG. 9 and FIG. 10 each indicate the noise current by the arrows of the broken lines. As illustrated in FIG. 9, while the noise current flows through the SET-side wire 21, the RESET-side wire 22, and the respective circular wires 8u, 8v, and 8w, a drop in voltage is caused in the SET-side wire 21, the RESET-side wire 22, and the respective circular wires 8u, 8v, and 8w, since the SET-side wire 21, the RESET-side wire 22, and the respective circular wires 8u, 8v, and 8w include the wiring resistors R0 to R12. The voltage drop in the SET-side wire 21, the RESET-side wire 22, and the respective circular wires 8u, 8v, and 8w decreases the source potentials of the SET-side level shifter 73 and the RESET-side level shifter 74 of the V-phase or the source potentials of the SET-side level shifter 75 and the RESET-side level shifter 76 of the W-phase more than the potential of the GND pad 2.

For example, when the noise current is defined as Is, the wiring resistor from the GND pad 2 to the source of the SET-side level shifter 75 of the W-phase is defined as Rsetw, and the wiring resistor from the GND pad 2 to the source of the RESET-side level shifter 76 of the W-phase is defined as Rrstw, the voltage drop of Is×Rsetw is caused in the source of the SET-side level shifter 75 of the W-phase, and the voltage drop of Is×Rrstw is caused in the source of the RESET-side level shifter 76. The wiring resistors Rsetw and Rrstw are a combined resistor of the wiring resistors R0 to R12 shown in FIG. 9, and are determined mainly depending on the resistance values of the wiring resistors R0 to R4.

The gate potentials of the SET-side level shifter 75 and the RESET-side level shifter 76 of the W-phase are each the GND potential except the period of driving the SET-side level shifter 75 and the RESET-side level shifter 76. The decrease in the source potentials of the SET-side level shifter 75 and the RESET-side level shifter 76 of the W-phase applies a positive voltage between the gate and the source of each of the SET-side level shifter 75 and the RESET-side level shifter 76. When this voltage exceeds a threshold voltage of the SET-side level shifter 75 and the RESET-side level shifter 76, the SET-side level shifter 75 and the RESET-side level shifter 76 are unintentionally turned ON.

To avoid such an error operation in the SET-side level shifters 71, 73, and 75 and the RESET-side level shifters 72, 74, and 76, the gate drive circuit 6u, 6v, and 6w is configured so as not to change the output when the SET signal and the RESET signal are simultaneously input, as shown in the States A and D in FIG. 6. When the wiring resistance between the respective SET-side level shifters 71, 73, and 75 and the GND pad 2 and the wiring resistance between the respective RESET-side level shifters 72, 74, and 76 and the GND pad 2 are the same, false turn-on is caused simultaneously at the SET-side level shifters 71, 73, and 75 and the RESET-side level shifters 72, 74, and 76 due to the −Vs noise, and the output of the gate drive circuit 6u, 6v, and 6w does not change, as shown in the State D in FIG. 6.

In the semiconductor device of the comparative example, however, the difference is caused between the wiring resistance between the respective SET-side level shifters 71, 73, and 75 and the GND pad 2 and the wiring resistance between the respective RESET-side level shifters 72, 74, and 76 and the GND pad 2. As illustrated in FIG. 9, the wiring resistance of the RESET-side wire 22 is larger than the wiring resistance of the SET-side wire 21 by the wiring resistor R0. For example, in the case of R=0.86Ω, R1=R2=0.71Ω, R3=R4=R7=R8=R11=R12=0.47Ω, and R5=R6=R9=R10=0.34Ω, the wiring resistor Rsetw from the GND pad 2 to the source of the SET-side level shifter 75 of the W-phase is about 0.51Ω, and the wiring resistor Rrstw from the GND pad 2 to the source of the RESET-side level shifter 76 is about 0.57Ω.

When the threshold voltage of the SET-side level shifter 75 and the RESET-side level shifter 76 is 1.5 V, a voltage of 1.5 V or greater is applied between the gate and the source of the RESET-side level shifter 76 by the noise current of about 2.6 A or greater, and the false turn-on is caused in the RESET-side level shifter 76. The false turn-on is caused in the SET-side level shifter 75 by the noise current of about 3.0 A or greater. The false turn-on is thus caused only in the RESET-side level shifter 76 when the noise current of about 2.6 A to 3.0 A flows. When the period in which the false turn-on is caused only in the RESET-side level shifter 76 exceeds a filter period, the gate drive circuit 6w causes a wrong operation.

Figure 11:
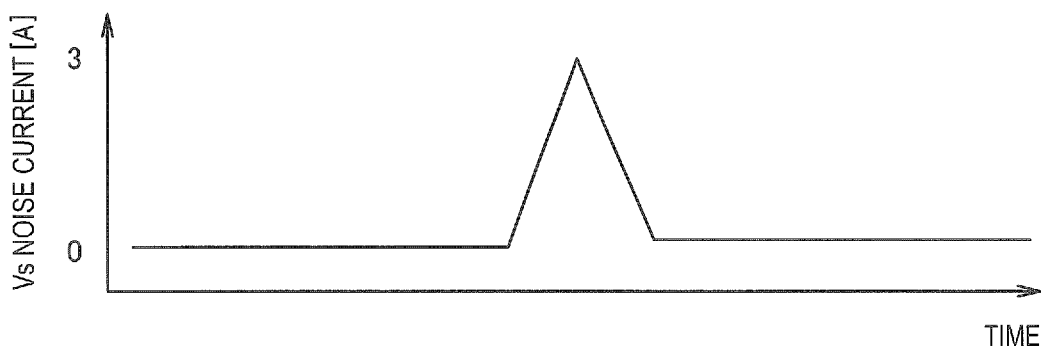
FIG. 11 is a graph showing the noise current upon the generation of the −Vs noise at the U-phase in the semiconductor device of the comparative example.
Figure 12:
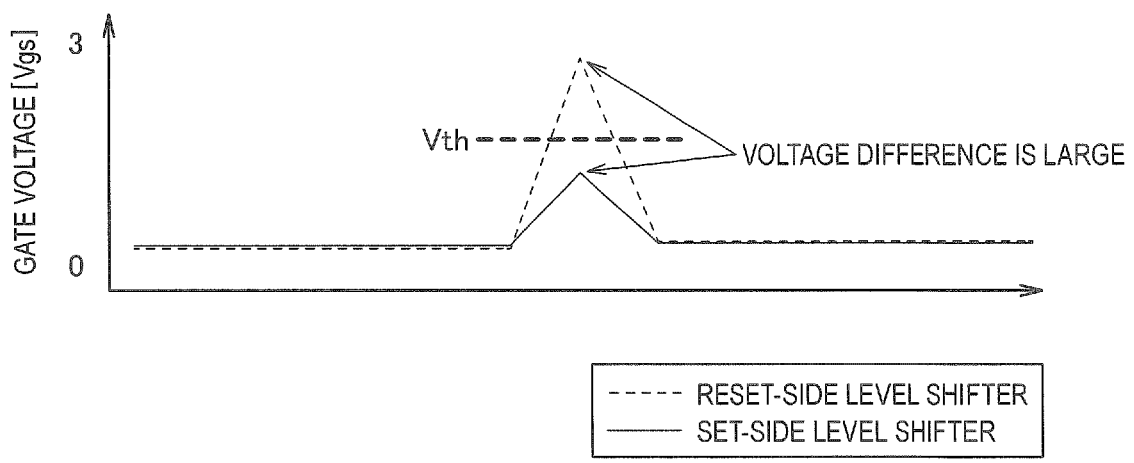
FIG. 12 is a graph showing a voltage between a gate and a source generated in a level shifter of a W-phase upon the generation of the −Vs noise at the U-phase in the semiconductor device of the comparative example.

FIG. 11 illustrates the noise current when the −Vs noise is caused in the U-phase in the semiconductor device of the comparative example, and FIG. 12 illustrates the voltage between the gate and source generated in each of the SET-side level shifter 75 and the RESET-side level shifter 76 of the W-phase when the −Vs noise is caused in the U-phase in the semiconductor device of the comparative example. As illustrated in FIG. 12, in the semiconductor device of the comparative example, the voltage difference between the SET-side level shifter 75 and the RESET-side level shifter 76 is large, and the gate drive circuit 6w tends to cause a wrong operation.

Figure 13:
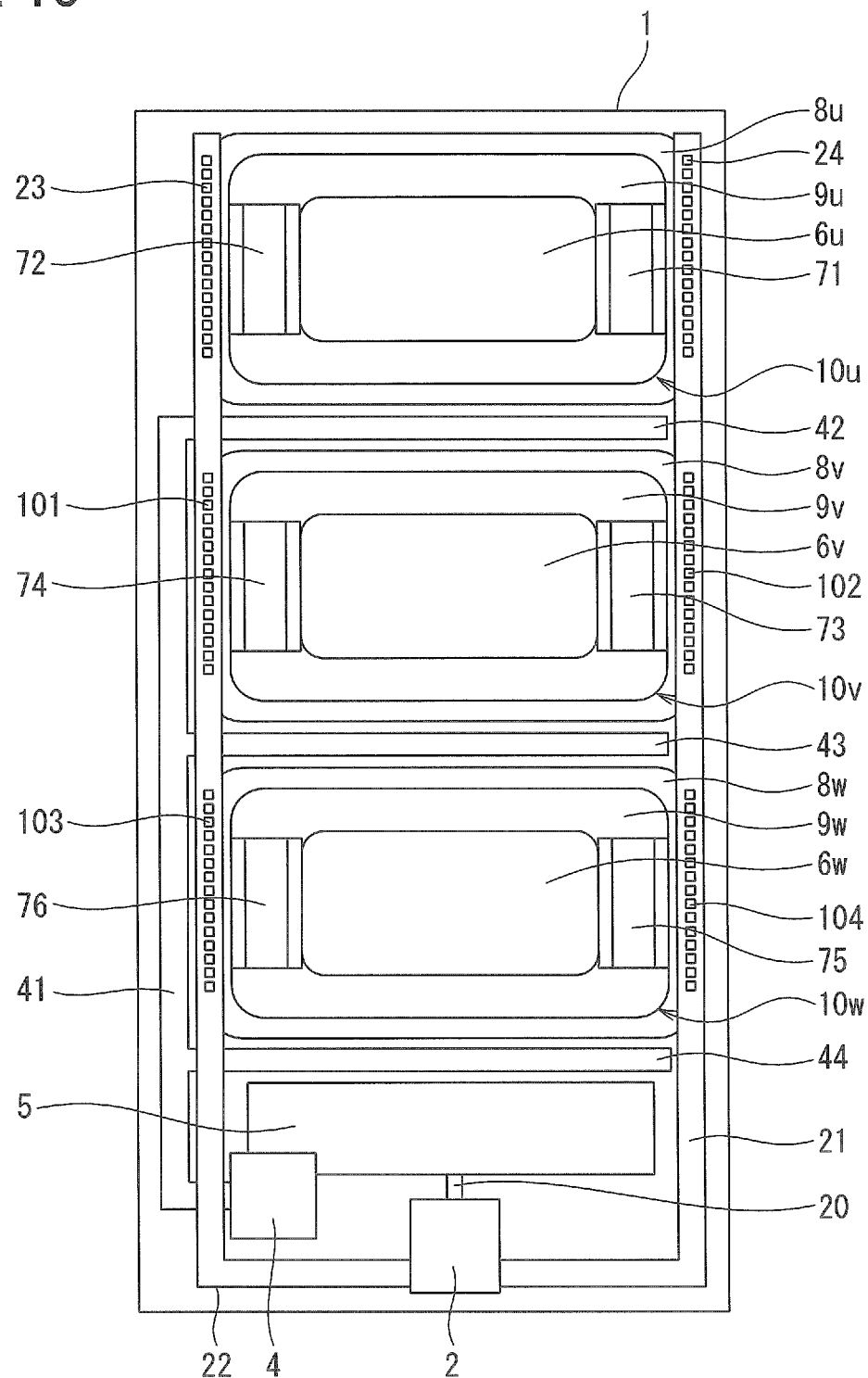
FIG. 13 is another plan view of the semiconductor device of the comparative example.

A case can be presumed, as illustrated in FIG. 13, in which the GND pad 2 is arranged in the middle of the semiconductor substrate 1 in the right-left direction so as to lead the wiring resistance between the respective SET-side level shifters 71, 73, and 75 and the GND pad 2 and the wiring resistance between the respective RESET-side level shifters 72, 74, and 76 and the GND pad 2 to be substantially the same. In addition, a case can be presumed, as illustrated in FIG. 14, in which a single GND wire 120 is connected to the GND pad 2, and is led to extend to the middle of the semiconductor substrate 1 in the right-left direction to be connected to the SET-side wire 21 and the RESET-side wire 22 so as to lead the wiring resistance between the respective SET-side level shifters 71, 73, and 75 and the GND pad 2 and the wiring resistance between the respective RESET-side level shifters 72, 74, and 76 and the GND pad 2 to be substantially the same.

Figure 14:
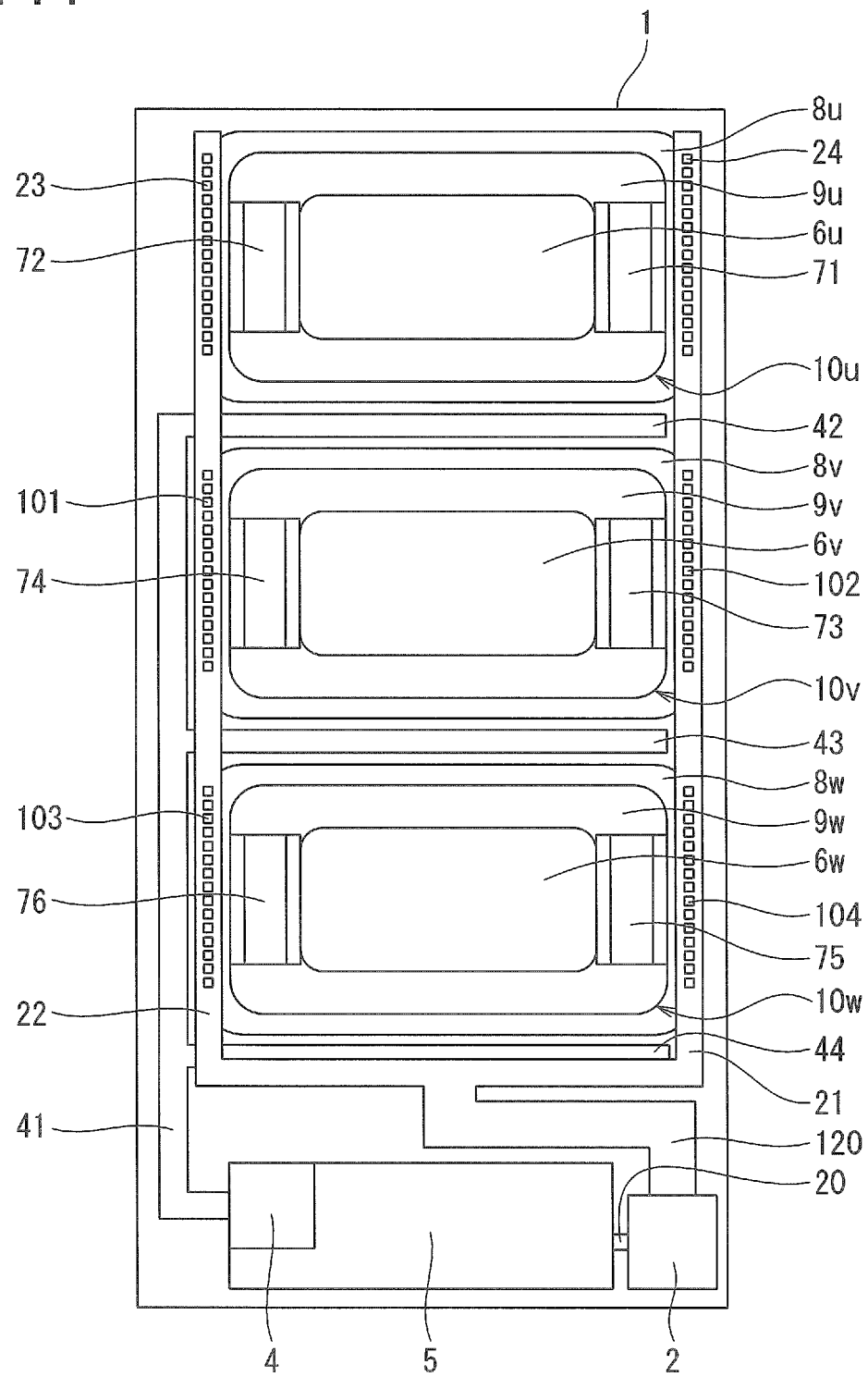
FIG. 14 is still another plan view of the semiconductor device of the comparative example.

However, the use of the planar layout as illustrated in FIG. 13 or FIG. 14 is difficult for reasons of packaging or layout of the control circuit 5. The difference is typically caused between the wiring resistance between the respective SET-side level shifters 71, 73, and 75 and the GND pad 2 and the wiring resistance between the respective RESET-side level shifters 72, 74, and 76 and the GND pad 2. This difference causes the false turn-on only in either the SET-side level shifters 71, 73, and 75 or the RESET-side level shifters 72, 74, and 76 upon the generation of the −Vs noise so as to be led to the State B or the State C shown in FIG. 6, and thus causes the output of the respective gate drive circuits 6u, 6v, and 6*w* to be inversed wrongly. The W-phase, which is located closest to the GND pad 2, tends to have such a problem.

<Operational Effects>

The semiconductor device according to the embodiment of the present invention has the configuration in which the circular wires 8*v* and 8*w* of the V-phase and the W-phase located closer to the GND pad 2 are electrically connected to the GND pad 2 via the circular wire 8*u* of the U-phase located further from the GND pad 2, so that the respective wiring paths have the same length between the GND pad 2 and the circular wires 8*v* and 8*w* of the V-phase and the W-phase. This configuration can lead a ratio Rset/Rrst of the wiring resistor Rset between the respective sources of the SET-side level shifters 73 and 75 of the V-phase and the W-phase and the GND pad 2 to the wiring resistor Rrst between the respective sources of the RESET-side level shifters 74 and 76 of the V-phase and the W-phase and the GND pad 2 to be closer to one than the semiconductor device of the comparative example, even though the GND pad 2 is located at the asymmetrical position with respect to the SET side and the RESET side, as in the case of the semiconductor device of the comparative example.

Figure 15:
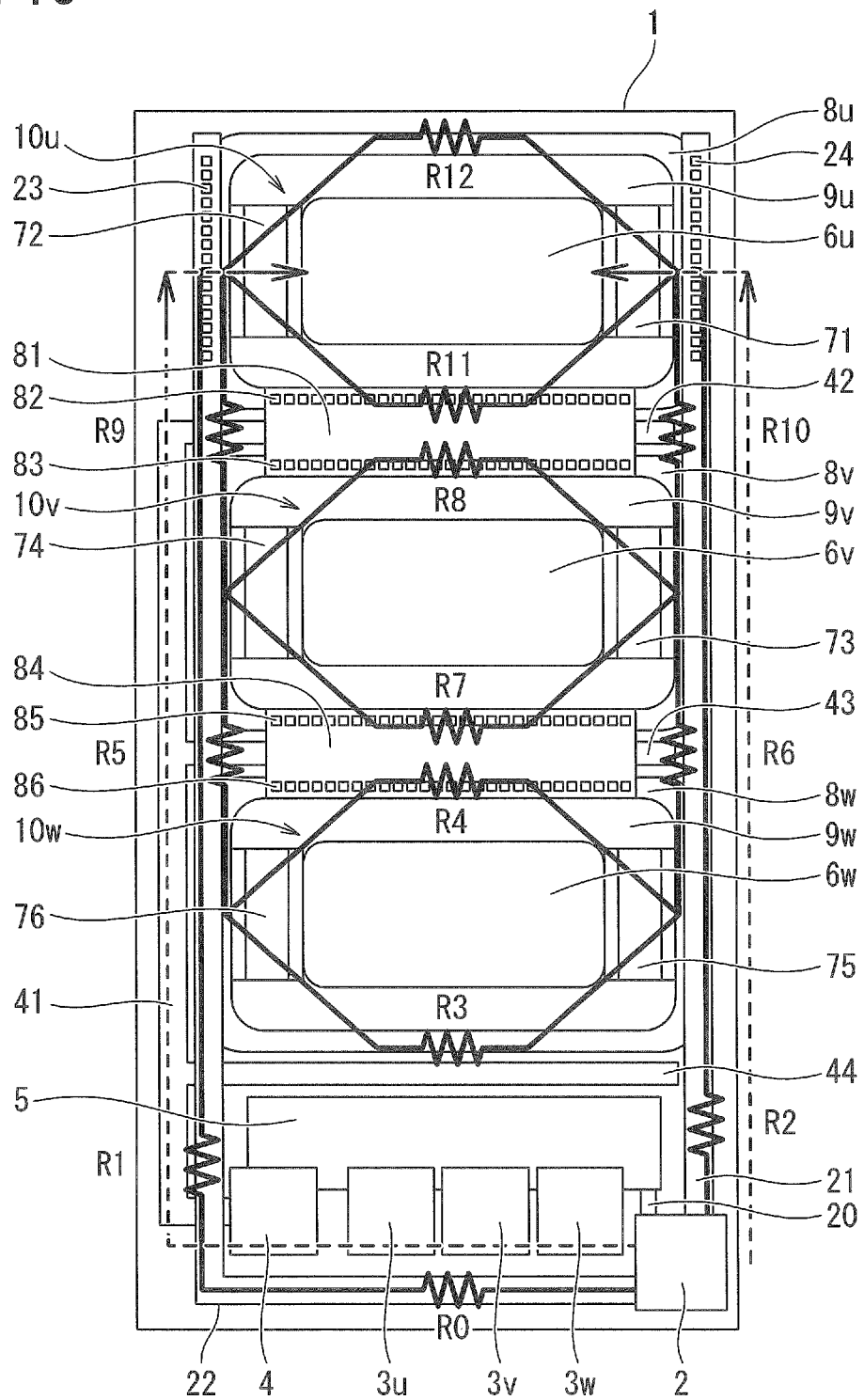
FIG. 15 is a plan view illustrating paths of a noise current upon generation of −Vs noise at a U-phase in the semiconductor device according to the embodiment of the present invention.

The explanations are made below with a case in which the −Vs noise is applied to the U-phase in the semiconductor device according to the embodiment of the present invention with reference to FIG. 15. FIG. 15 indicates the paths of the noise current by the arrows of the broken lines when the −Vs noise is applied to the U-phase. FIG. 15 also schematically illustrates the wiring resistors R0 to R12 of the SET-side wire 21, the RESET-side wire 22, and the respective circular wires 8*u*, 8*v*, and 8*w*. When the −Vs noise is applied to the U-phase, the noise current flows through the SET-side wire 21, the RESET-side wire 22, and the respective circular wires 8*u*, 8*v*, and 8*w*, and the voltage drop is caused in the SET-side wire 21, the RESET-side wire 22, and the respective circular wires 8*u*, 8*v*, and 8*w*.

However, since most of the noise current flows through the circular wire 8*u* of the U-phase, and the noise current flowing through the circular wires 8*v* and 8*w* of the V-phase and the W-phase is small, the difference in the drop of the source potential between the SET side and the RESET side in the SET-side level shifters 73 and 75 and the RESET-side level shifters 74 and 76 of the V-phase and the W-phase is not large. The SET side and the RESET side are thus simultaneously turned ON so as to be led to the State D4 shown in FIG. 6 even if the false turn-on is caused in the SET-side level shifters 73 and 75 and the RESET-side level shifters 74 and 76 of the V-phase and the W-phase, which does not cause the wrong inversion of the output of the gate drive circuit 6*v* and 6*w*.

In addition, since the SET-side level shifter 71 and the RESET-side level shifter 72 of the U-phase is in the reverse-bias state during the application of the −Vs noise, any signal is not transmitted even if the voltage of the threshold or greater is applied between the gate and the source due to the voltage drop caused in the SET-side wire 21, the RESET-side wire 22, and the circular wire 8*u*, which does not cause the wrong inversion of the output of the gate drive circuit 6*u*.

Figure 16:
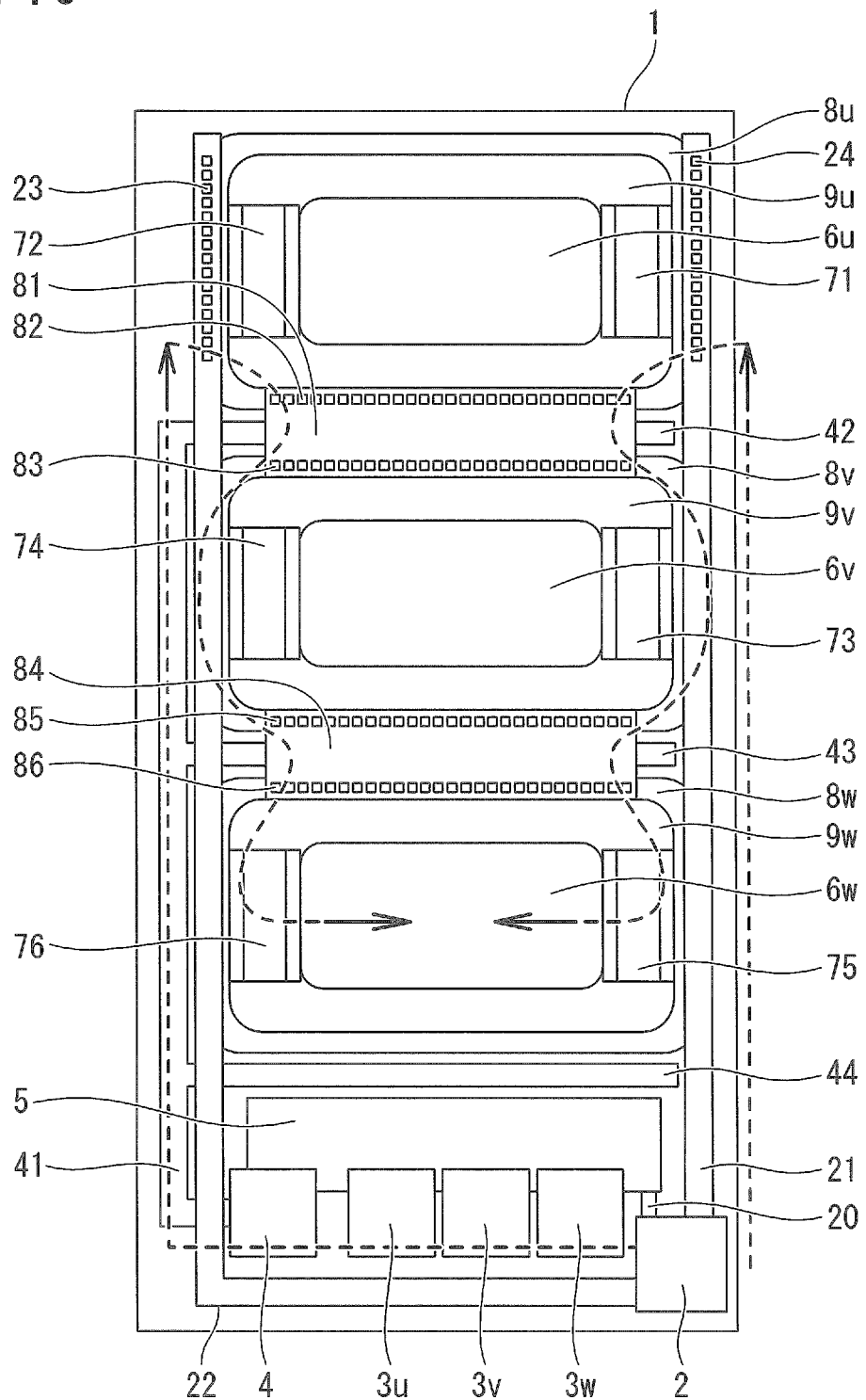
FIG. 16 is a plan view illustrating paths of a noise current upon generation of −Vs noise at a W-phase in the semiconductor device according to the embodiment of the present invention.
Figure 17:
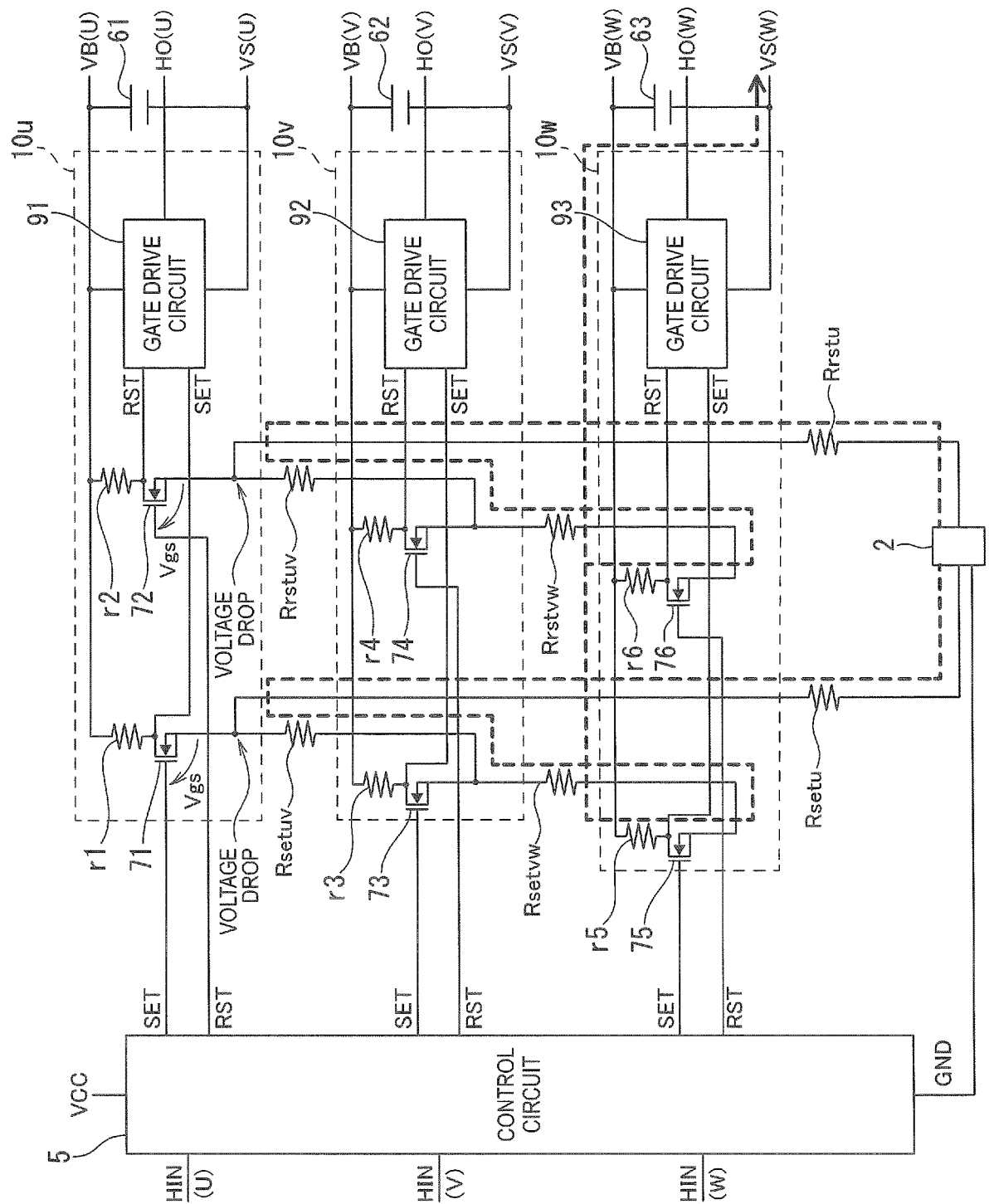
FIG. 17 is a circuit diagram illustrating the paths of the noise current upon the generation of the −Vs noise at the W-phase in the semiconductor device according to the embodiment of the present invention.

The explanations are made below with a case in which the −Vs noise is applied to the W-phase in the semiconductor device according to the embodiment of the present invention with reference to FIG. 16 and FIG. 17. FIG. 16 and FIG. 17 indicate the paths of the noise current by the arrows of the broken lines when the −Vs noise is applied to the W-phase. As illustrated in FIG. 16, when the −Vs noise is applied to the W-phase, the noise current flows through the SET-side wire 21, the RESET-side wire 22, and the circular wire 8*u* connecting the GND pad 2 with the SET-side level shifter 71 and the RESET-side level shifter 72 of the U-phase, and further flows in the W-phase via the connection wire 81 and the circular wire 8*v* connecting the U-phase with the V-phase and the connection wire 84 and the circular wire 8*w* connecting the V-phase with the W-phase. The flow of the noise current causes the voltage drop in the SET-side wire 21, the RESET-side wire 22, the circular wire 8*u*, the connection wire 81, the circular wire 8*v*, the connection wire 84, and the circular wire 8*w*, which may cause the false turn-on in the SET-side level shifters 71 and 73 and the RESET-side level shifters 72 and 74 of the U-phase and the V-phase.

In the semiconductor device of the comparative example, the ratio Rrst/Rset of the wiring resistors of the SET-side level shifter 75 and the RESET-side level shifter 76 of the W-phase is the largest among the U-phase, the V-phase, and the W-phase, and the wrong inversion of the output of the gate drive circuit 6*w* tends to be caused due to the false turn-on of the SET-side level shifter 75 and the RESET-side level shifter 76. In the semiconductor device according to the embodiment of the present invention, the ratio Rrst/Rset of the wiring resistors of the SET-side level shifter 71 and the RESET-side level shifter 72 of the U-phase is the largest among the U-phase, the V-phase, and the W-phase. However, the ratio Rrst/Rset of the wiring resistors of the SET-side level shifter 71 and the RESET-side level shifter 72 of the U-phase in the semiconductor device according to the embodiment of the present invention is closer to one than the ratio Rrst/Rset of the wiring resistors of the SET-side level shifter 75 and the RESET-side level shifter 76 of the W-phase in the semiconductor device of the comparative example.

Figure 18:
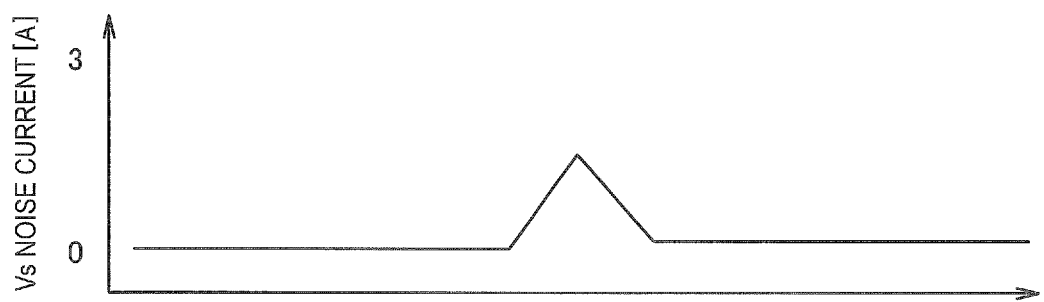
FIG. 18 is a graph showing the noise current upon the generation of the −Vs noise at the W-phase in the semiconductor device according to the embodiment of the present invention.
Figure 19:
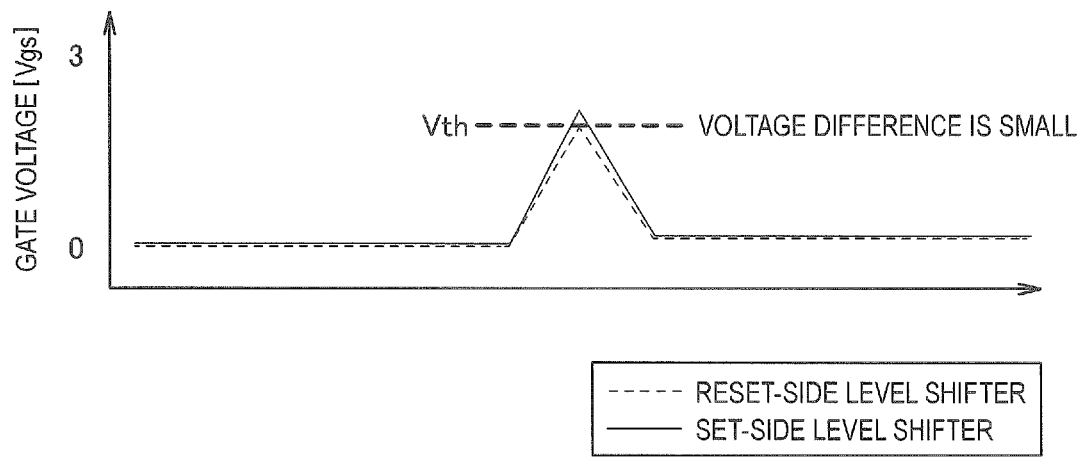
FIG. 19 is a graph showing a voltage between a gate and a source generated in the level shifter of the U-phase upon the generation of the −Vs noise at the W-phase in the semiconductor device according to the embodiment of the present invention.

FIG. 18 illustrates the noise current when the −Vs noise is caused in the W-phase in the semiconductor device according to the embodiment of the present invention, and FIG. 19 illustrates the voltage between the gate and source generated in each of the SET-side level shifter 71 and the RESET-side level shifter 72 of the U-phase when the −Vs noise is caused in the W-phase in the semiconductor device according to the embodiment of the present invention. As illustrated in FIG. 19, in the semiconductor device according to the embodiment of the present invention, the voltage difference between the SET-side level shifter 71 and the RESET-side level shifter 72 of the U-phase is smaller than the voltage difference between the SET-side level shifter 75 and the RESET-side level shifter 76 of the W-phase in the semiconductor device of the comparative example illustrated in FIG. 12, so as to avoid the wrong inversion of the output of the gate drive circuit 6*u*.

FIG. 20 is a table showing a comparison of the specifications of the GND wiring resistors between the semiconductor device according to the embodiment of the present invention (indicated by "Present Invention" in FIG. 20) and the semiconductor device of the comparative example (indicated by "Conventional Structure" in FIG. 20). In the semiconductor device of the comparative example, the resistance ratio of the SET side and the RESET side of the wiring resistor between the GND pad and the level shifter in the W-phase is 1.126, which is the largest among the three phases, and the difference in the drop of the source voltage in the W-phase is 0.168 V, which is much larger than the other phases. In the semiconductor device according to the embodiment of the present invention, the resistance ratio of the SET side and the RESET side of the wiring resistor between the GND pad and the level shifter in the U-phase is 1.024, which is the largest among the three phases but smaller than the resistance ratio in the W-phase in the semiconductor device of the comparative example. In addition, the difference in the drop of the source voltage in the U-phase is 0.034 V, which is smaller than the difference in the W-phase in the semiconductor device of the comparative example.

First Modified Example

Figure 21:
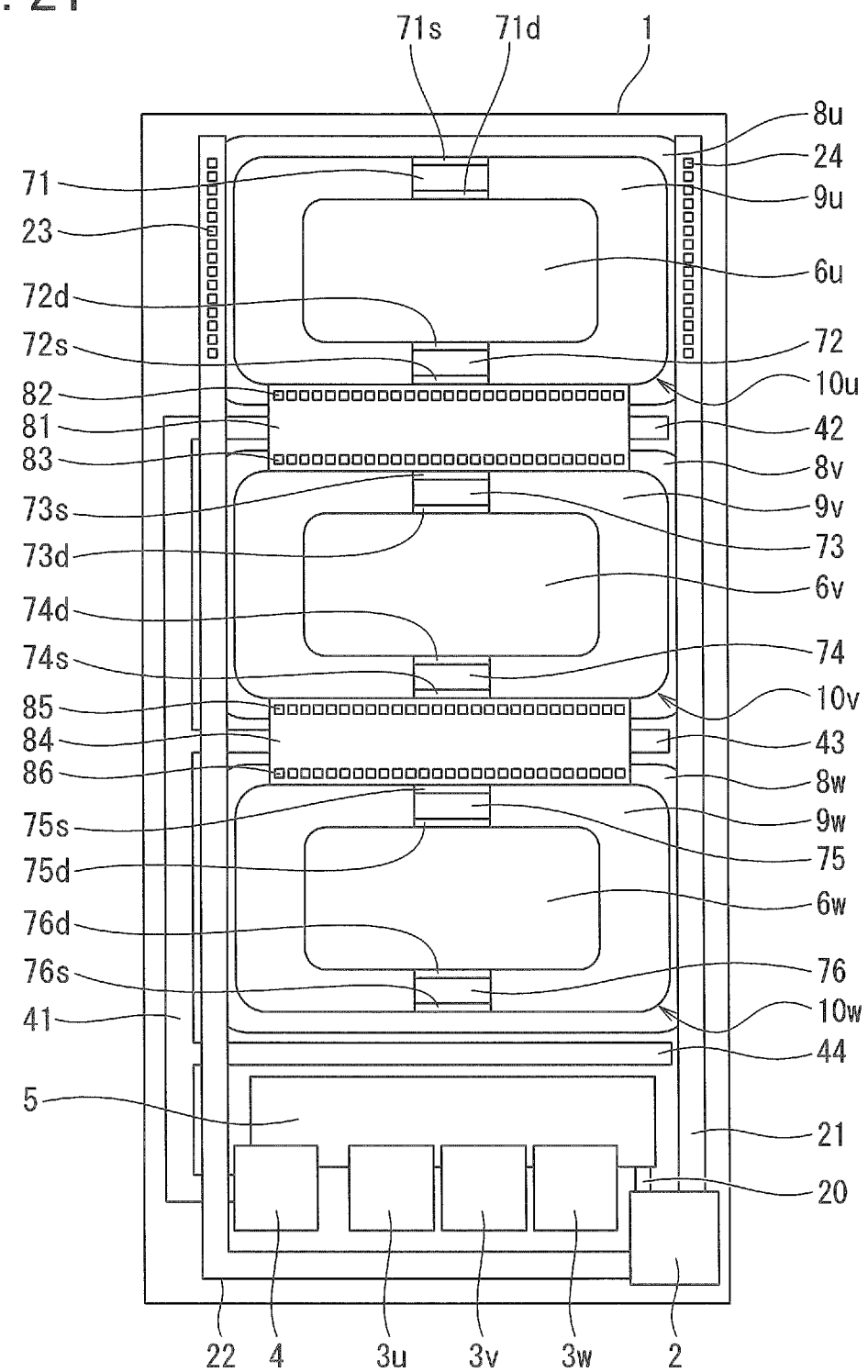
FIG. 21 is a plan view illustrating a semiconductor device according to a first modified example of the embodiment of the present invention.

The semiconductor device according to a first modified example of the embodiment of the present invention differs from the semiconductor device according to the embodiment of the present invention illustrated in FIG. 1 in that the SET-side level shifters 71, 73, and 75 and the RESET-side level shifters 72, 74, and 76 of the U-phase, the V-phase, and the W-phase are arranged in the upper-lower direction in the sheet of the drawing, as illustrated in FIG. 21. The other configurations of the semiconductor device according to the first modified example of the embodiment of the present invention are the same as those of the semiconductor device according to the embodiment of the present invention, and overlapping explanations are not repeated below.

The semiconductor device according to the first modified example of the embodiment of the present invention does not limit the respective arrangement positions of the SET-side level shifters 71, 73, and 75 and the RESET-side level shifters 72, 74, and 76 of the U-phase, the V-phase, and the W-phase. The semiconductor device according to the first modified example of the embodiment of the present invention, in which the SET-side level shifters 71, 73, and 75 and the RESET-side level shifters 72, 74, and 76 of the U-phase, the V-phase, and the W-phase are arranged in the upper-lower direction in the sheet of the drawing, can also achieve the effects similar to the semiconductor device according to the embodiment of the present invention.

Second Modified Example

Figure 22:
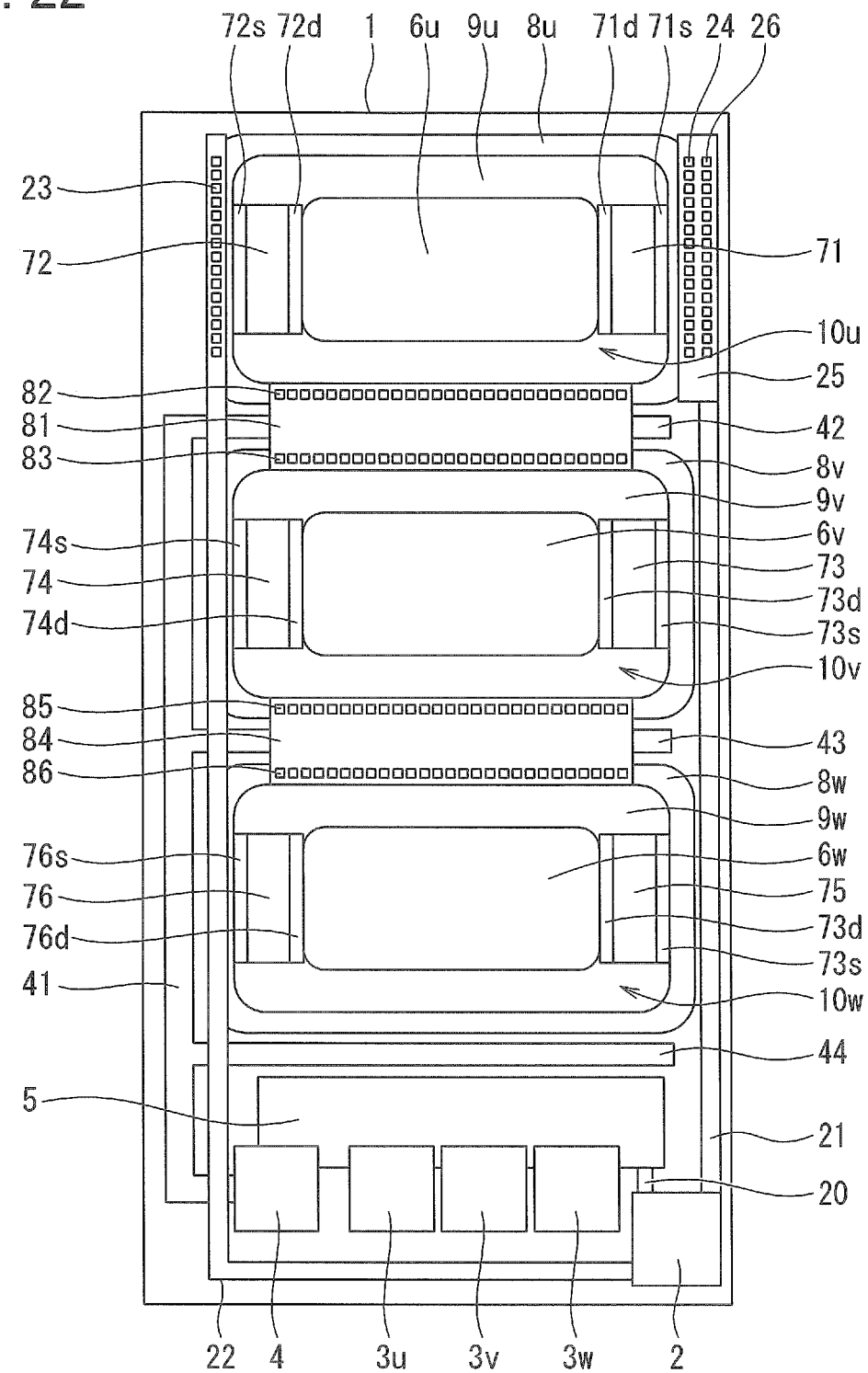
FIG. 22 is a plan view illustrating a semiconductor device according to a second modified example of the embodiment of the present invention.

The semiconductor device according to a second modified example of the embodiment of the present invention differs from the semiconductor device according to the embodiment of the present invention illustrated in FIG. 1 in that the SET-side wire 21 is arranged at the layer under the RESET-side wire 22, as illustrated in FIG. 22. The SET-side wire 21 is arranged at the same wiring layer as the respective circular wires 8u, 8v, and 8w, and is located at a position separated from the respective circular wires 8u, 8v, and 8w. The SET-side wire 21 is connected to a connection wire 25 arranged at the layer over the SET-side wire 21 via contacts 26. The connection wire 25 is connected to the circular wire 8u via the contacts 24. The other configurations of the semiconductor device according to the second modified example of the embodiment of the present invention are the same as those of the semiconductor device according to the embodiment of the present invention, and overlapping explanations are not repeated below.

The semiconductor device according to the second modified example of the embodiment of the present invention, in which the SET-side wire 21 is arranged at the layer under the RESET-side wire 22, can lead the SET-side wire 21 to be connected to the circular wire 8u via the connection wire 25, so as to achieve the effects similar to the semiconductor device according to the embodiment of the present invention.

Third Modified Example

Figure 23:
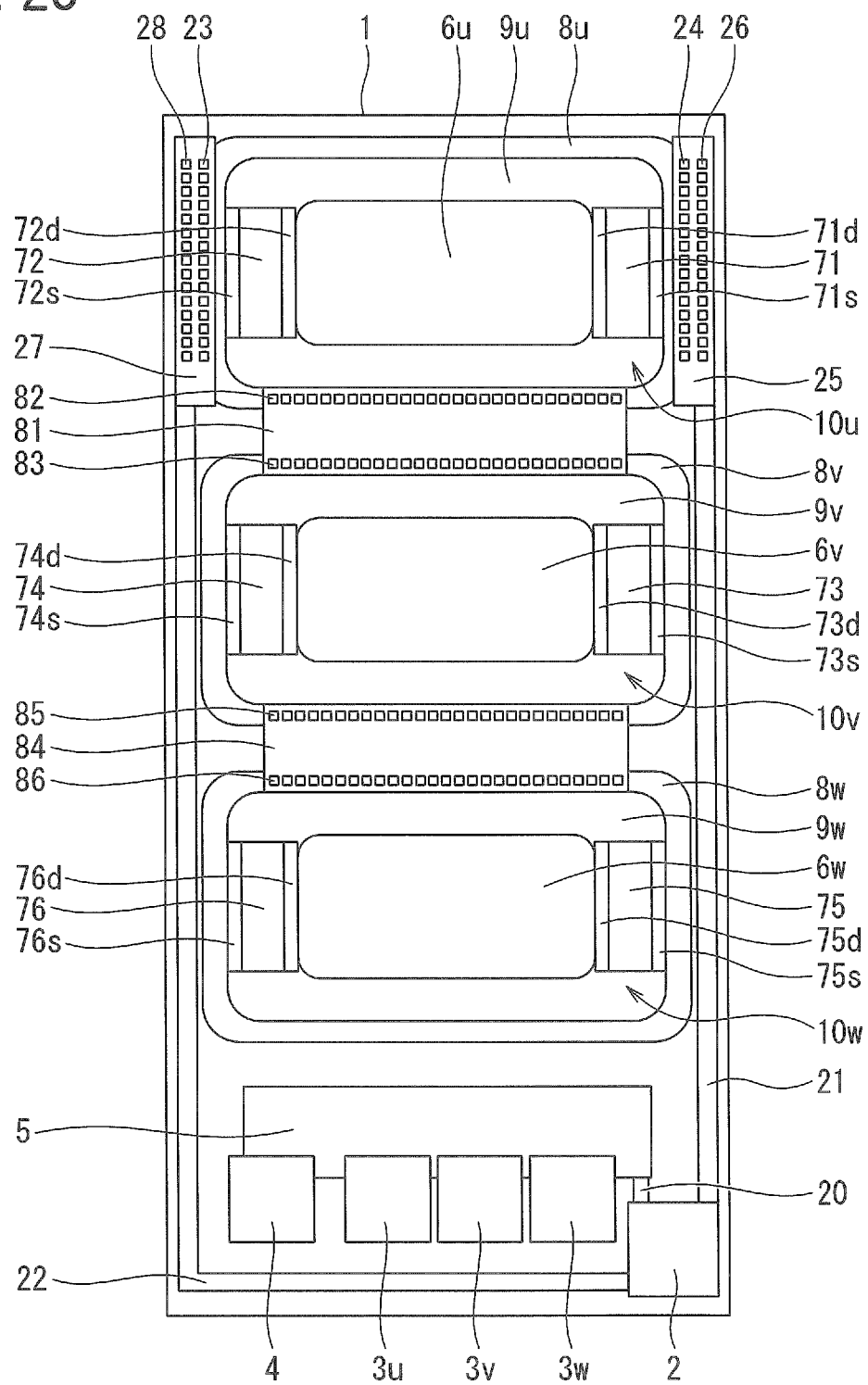
FIG. 23 is a plan view illustrating a semiconductor device according to a third modified example of the embodiment of the present invention.

The semiconductor device according to a third modified example of the embodiment of the present invention differs from the semiconductor device according to the embodiment of the present invention illustrated in FIG. 1 in not including the VCC wires 41 to 44, as illustrated in FIG. 23. The semiconductor device according to the third modified example of the embodiment of the present invention further differs from the semiconductor device according to the embodiment of the present invention in that the SET-side wire 21 and the RESET-side wire 22 are arranged at the same wiring layer as the respective circular wires 8u, 8v, and 8w.

The SET-side wire 21 is arranged at a position separated from the respective circular wires 8u, 8v, and 8w. The SET-side wire 21 is connected to the connection wire 25 arranged at the layer over the SET-side wire 21 via the contacts 26. The RESET-side wire 22 is arranged at a position separated from the respective circular wires 8u, 8v, and 8w. The RESET-side wire 22 is connected to a connection wire 27 arranged at the layer over the RESET-side wire 22 via the contacts 28. The connection wire 27 is connected to the circular wire 8u via the contacts 23. The other configurations of the semiconductor device according to the third modified example of the embodiment of the present invention are the same as those of the semiconductor device according to the embodiment of the present invention, and overlapping explanations are not repeated below.

The semiconductor device according to the third modified example of the embodiment of the present invention, in which the SET-side wire 21 and the RESET-side wire 22 are arranged at the same wiring layer as the respective circular wires 8u, 8v, and 8w, without the inclusion of the VCC wires 41 to 44, can lead the SET-side wire 21 and the RESET-side wire 22 to be connected to the circular wire 8u via the connection wires 25 and 27, so as to achieve the effects similar to the semiconductor device according to the embodiment of the present invention.

Fourth Modified Example

Figure 24:
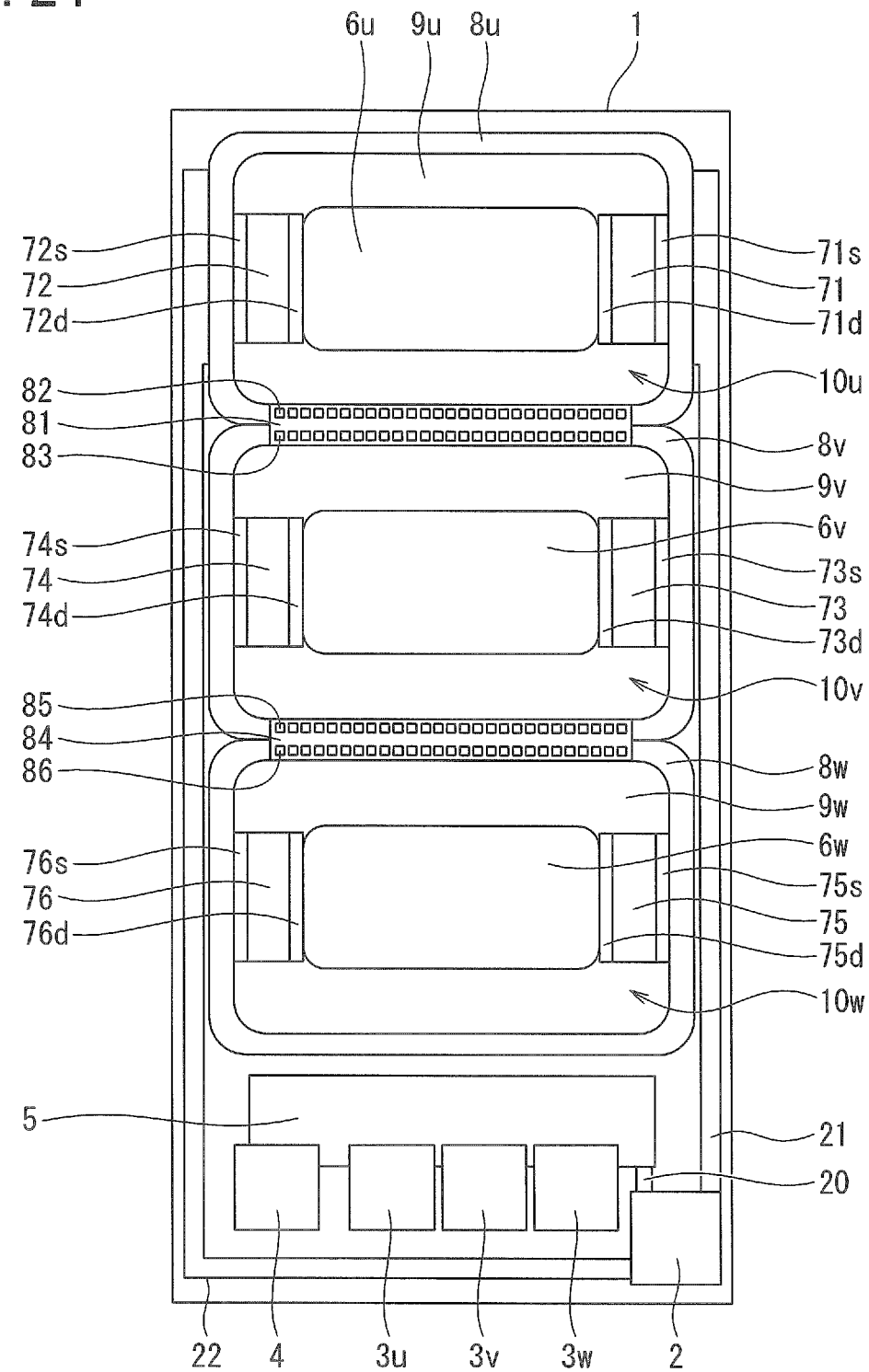
FIG. 24 is a plan view illustrating a semiconductor device according to a fourth modified example of the embodiment of the present invention.

The semiconductor device according to a fourth modified example of the embodiment of the present invention has the same configuration as the semiconductor device according to the third modified example illustrated in FIG. 23 in that the VCC wires 41 to 44 are not provided, and the SET-side wire 21 and the RESET-side wire 22 are arranged at the same wiring layer as the respective circular wires 8u, 8v, and 8w, as illustrated in FIG. 24. The semiconductor device according to the fourth modified example of the embodiment of the present invention differs from the semiconductor device according to the third modified example in that the SET-side wire 21 and the RESET-side wire 22 are in direct contact with the circular wire 8u without the use of the connection wire 25 or 27. For example, as illustrated in FIG. 24, the respective end parts of the SET-side wire 21 and the RESET-side wire 22 project toward the circular wire 8u so as to be directly connected to the circular wire 8u.

The semiconductor device according to the fourth modified example of the embodiment of the present invention further differs from the semiconductor device according to the third modified example illustrated in FIG. 23 in that the circular wires 8u, 8v, and 8w of the U-phase, the V-phase, and the W-phase are in direct contact with each other.

The connection wires 81 and 84 are arranged at the layer over the respective circular wires 8u, 8v, and 8w so as to overlap with the regions in which the circular wires 8u, 8v, and 8w of the U-phase, the V-phase, and the W-phase are in direct contact with each other. The circular wires 8u and 8v are connected to the connection wire 81 via the contacts 82 and 83. The circular wires 8v and 8w are connected to the connection wire 84 via the contacts 85 and 86. The arrangement of the connection wires 81 and 84 can reduce the wiring resistance. The semiconductor device according to the fourth modified example may have a configuration in which the circular wires 8u, 8v, and 8w are directly connected to each other without the use of the connection wire 81 or 84. The other configurations of the semiconductor device according to the fourth modified example of the embodiment of the present invention are the same as those of the semiconductor device according to the embodiment of the present invention, and overlapping explanations are not repeated below.

The semiconductor device according to the fourth modified example of the embodiment of the present invention, in which the SET-side wire 21 and the RESET-side wire 22 are in direct contact with the circular wire 8u, or in which the circular wires 8u, 8v, and 8w are in direct contact with each other, can achieve the effects similar to the semiconductor device according to the embodiment of the present invention.

Fifth Modified Example

The semiconductor device according to a fifth modified example of the embodiment of the present invention differs from the semiconductor device according to the embodiment of the present invention illustrated in FIG. 1 in that the first wires 8u1, 8v1, and 8w1 electrically connected to the SET-side level shifters 71, 73, and 75 of the high-potential-side circuit regions 10u, 10v, and 10w of the U-phase, the V-phase, and the W-phase are separated from the second wires 8u2, 8v2, and 8w2 electrically connected to the RESET-side level shifters 72, 74, and 76.

Figure 25:
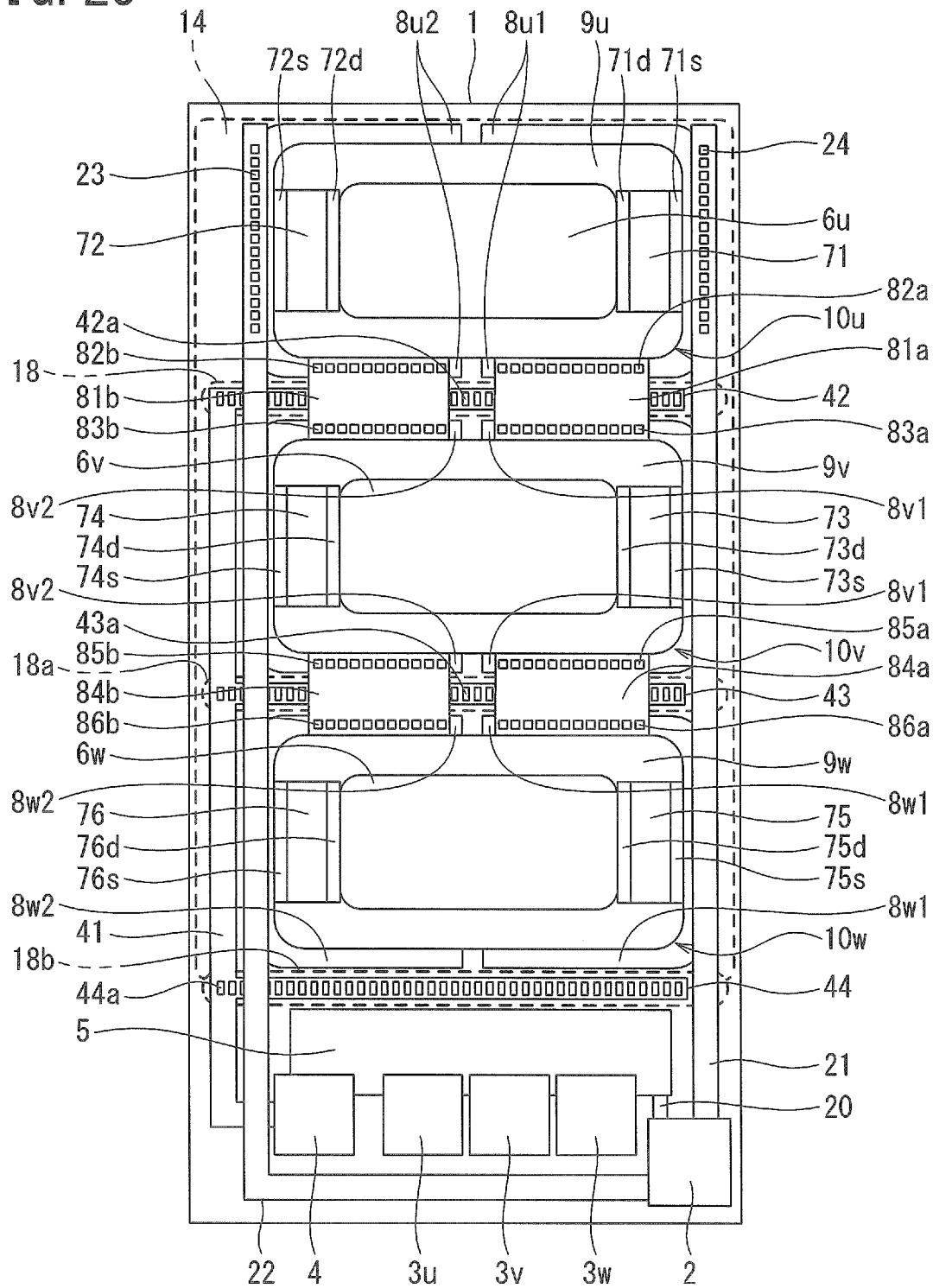
FIG. 25 is a plan view illustrating a semiconductor device according to a fifth modified example of the embodiment of the present invention.

FIG. 25 schematically indicates, by the broken lines, the p-type base region 14 provided in the semiconductor substrate 1, and the n-type semiconductor regions 18, 18a and 18b provided in the semiconductor substrate 1 immediately under the VCC wires 42, 43, and 44. The VCC wires 42, 43, and 44 are electrically connected to the n-type semiconductor regions 18, 18a and 18b via contacts 42a, 43a, and 44a.

The first wires 8u1 and 8v1 of the adjacent high-potential-side circuit regions 10u and 10v of the U-phase and the V-phase are separated from each other, and the second wires 8u2 and 8v2 are also separated from each other. The first wires 8v1 and 8w1 of the adjacent high-potential-side circuit regions 10v and 10w of the V-phase and the W-phase are separated from each other, and the second wires 8v2 and 8w2 are also separated from each other.

The first wire 8w1 of the high-potential-side circuit region 10w of the W-phase located closer to the GND pad 2 is electrically connected to the SET-side wire 21 via the first wire 8v1 of the high-potential-side circuit region 10v of the V-phase located further from the GND pad 2. The second wire 8w2 of the high-potential-side circuit region 10w of the W-phase located closer to the GND pad 2 is electrically connected to the RESET-side wire 22 via the second wire 8v2 of the high-potential-side circuit region 10v of the V-phase located further from the GND pad 2.

The first wire 8v1 of the high-potential-side circuit region 10v of the V-phase located closer to the GND pad 2 is electrically connected to the SET-side wire 21 via the first wire 8u1 of the high-potential-side circuit region 10u of the U-phase located further from the GND pad 2. The second wire 8v2 of the high-potential-side circuit region 10v of the V-phase located closer to the GND pad 2 is electrically connected to the RESET-side wire 22 via the second wire 8u2 of the high-potential-side circuit region 10u of the U-phase located further from the GND pad 2.

The semiconductor device according to the fifth modified example of the embodiment of the present invention further differs from the semiconductor device according to the embodiment of the present invention illustrated in FIG. 1 in that the first connection wires 81a and 84a electrically connecting the respective first wires 8u1, 8v1, and 8w1 of the high-potential-side circuit regions 10u, 10v, and 10w of the U-phase, the V-phase, and the W-phase are separated from the second connection wires 81b and 84b electrically connecting the respective second wires 8u2, 8v2, and 8w2 of the high-potential-side circuit regions 10u, 10v, and 10w of the U-phase, the V-phase, and the W-phase.

The first connection wires 81a and 84a and the second connection wires 81b and 84b are located at the layer over the respective first wires 8u1, 8v1, and 8w1 and the respective second wires 8u2, 8v2, and 8w2 of the high-potential-side circuit regions 10u, 10v, and 10w of the U-phase, the V-phase, and the W-phase. The first connection wire 81a electrically connects the first wires 8u1 and 8v1 of the high-potential-side circuit regions 10u and 10v of the U-phase and the V-phase adjacent to each other via the contacts 82a and 83a. The second connection wire 81b electrically connects the second wires 8u2 and 8v2 of the high-potential-side circuit regions 10u and 10v of the U-phase and the V-phase adjacent to each other via the contacts 82b and 83b.

The first connection wire 84a electrically connects the first wires 8v1 and 8w1 of the high-potential-side circuit regions 10v and 10w of the V-phase and the W-phase adjacent to each other via the contacts 85a and 86a. The second connection wire 84b electrically connects the second wires 8v2 and 8w2 of the high-potential-side circuit regions 10v and 10w of the V-phase and the W-phase adjacent to each other via the contacts 85b and 86b. The other configurations of the semiconductor device according to the fifth modified example of the embodiment of the present invention are the same as those of the semiconductor device according to the embodiment of the present invention, and overlapping explanations are not repeated below.

The semiconductor device according to the fifth modified example of the embodiment of the present invention, in which the first wires 8u1, 8v1, and 8w1 electrically connected to the SET-side level shifters 71, 73, and 75 are separated from the second wires 8u2, 8v2, and 8w2 electrically connected to the RESET-side level shifters 72, 74, and 76, and in which the first connection wires 81a and 84a electrically connecting the respective first wires 8u1, 8v1, and 8w1 of the high-potential-side circuit regions 10u, 10v, and 10w of the U-phase, the V-phase, and the W-phase are separated from the second connection wires 81b and 84b electrically connecting the respective second wires 8u2, 8v2, and 8w2 of the high-potential-side circuit regions 10u, 10v, and 10w of the U-phase, the V-phase, and the W-phase, can achieve the effects similar to the semiconductor device according to the embodiment of the present invention.

Sixth Modified Example

Figure 26:
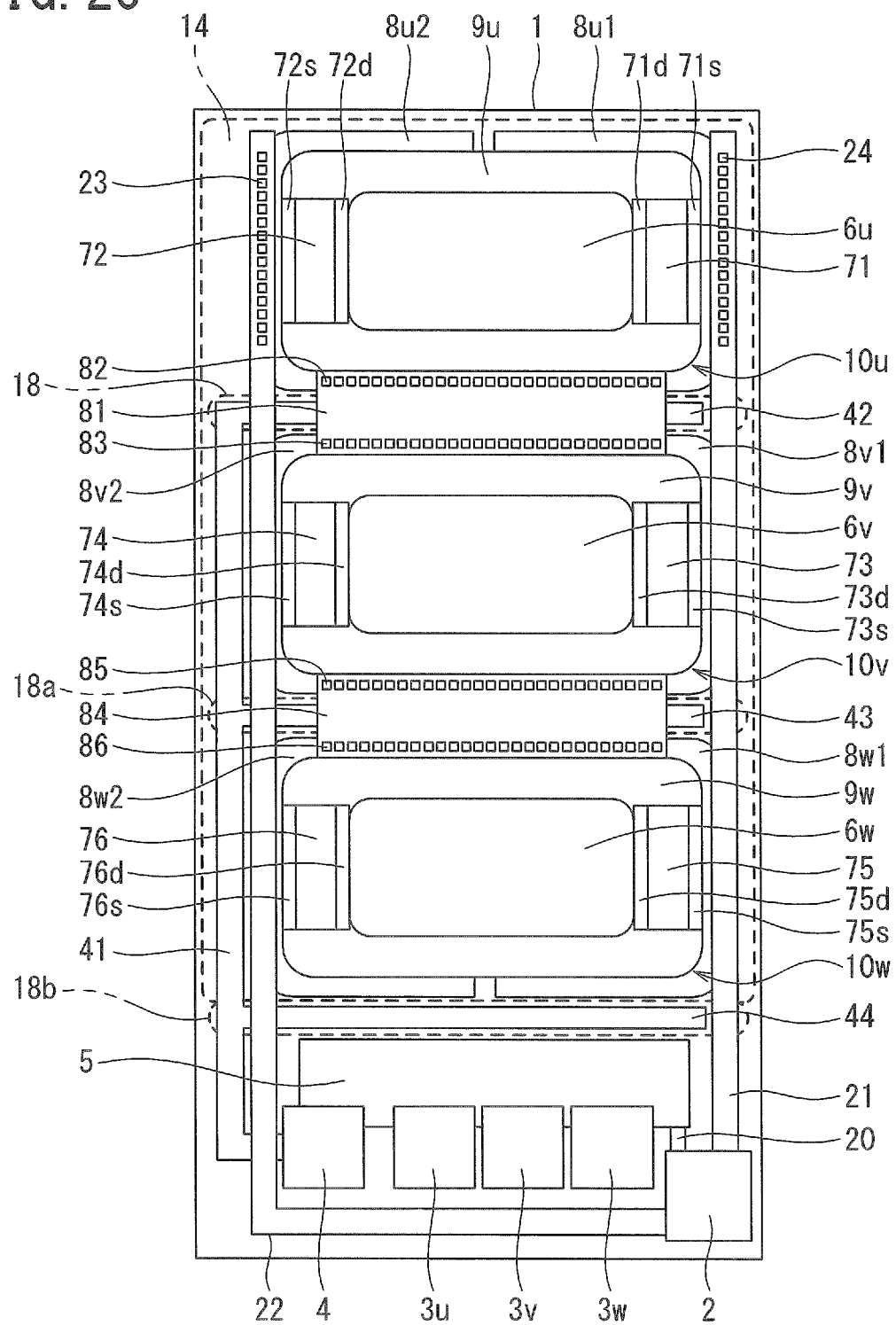
FIG. 26 is a plan view illustrating a semiconductor device according to a sixth modified example of the embodiment of the present invention.

The semiconductor device according to a sixth modified example of the embodiment of the present invention has the same configuration as the semiconductor device according to the fifth modified example of the embodiment of the present invention illustrated in FIG. 25 in that the first wires 8u1, 8v1, and 8w1 electrically connected to the SET-side level shifters 71, 73, and 75 of the high-potential-side circuit regions 10u, 10v, and 10w of the U-phase, the V-phase, and the W-phase are separated from the second wires 8u2, 8v2, and 8w2 electrically connected to the RESET-side level shifters 72, 74, and 76, as illustrated in FIG. 26.

The semiconductor device according to the sixth modified example of the embodiment of the present invention differs from the semiconductor device according to the fifth modified example of the embodiment of the present invention illustrated in FIG. 25 in that the first connection wires electrically connecting the respective first wires 8u1, 8v1, and 8w1 of the high-potential-side circuit regions 10u, 10v, and 10w are connected to the second connection wires electrically connecting the respective second wires 8u2, 8v2, and 8w2 of the same high-potential-side circuit regions 10u, 10v, and 10w so as to compose the respective connection wires 81 and 84.

FIG. 26 also schematically indicates, by the broken lines, the p-type base region 14, and the n-type semiconductor regions 18, 18a and 18b provided immediately under the VCC wires 42, 43, and 44, as in the case of FIG. 25. The VCC wires 42, 43, and 44 are electrically connected to the n-type semiconductor regions 18, 18a and 18b via the contacts (not illustrated). The other configurations of the semiconductor device according to the sixth modified example of the embodiment of the present invention are the same as those of the semiconductor device according to the fifth modified example, and overlapping explanations are not repeated below.

The semiconductor device according to the sixth modified example of the embodiment of the present invention, in which the first wires 8u1, 8v1, and 8w1 electrically connected to the SET-side level shifters 71, 73, and 75 are separated from the second wires 8u2, 8v2, and 8w2 electrically connected to the RESET-side level shifters 72, 74, and 76, and in which the first connection wires electrically connecting the respective first wires 8u1, 8v1, and 8w1 of the high-potential-side circuit regions 10u, 10v, and 10w are connected to the second connection wires electrically connecting the respective second wires 8u2, 8v2, and 8w2 of the same high-potential-side circuit regions 10u, 10v, and 10w so as to compose the respective connection wires 81 and 84, can achieve the effects similar to the semiconductor device according to the embodiment of the present invention.

Other Embodiments

While the present invention has been described above by reference to the embodiment and modified examples, it should be understood that the present invention is not intended to be limited to the descriptions and the drawings composing part of this disclosure. Various alternative embodiments, examples, and technical applications will be apparent to those skilled in the art according to this disclosure.

The respective configurations disclosed in the embodiment of the present invention and the respective modified examples can be combined together as necessary within a range without contradicting each other. For example, the semiconductor device according to the embodiment of the present invention and the respective semiconductor devices according to the first to fourth modified examples of the embodiment of the present invention may include the first wires 8u1, 8v1, and 8w1 and the second wires 8u2, 8v2, and 8w2 separated from each other, instead of the circular wires 8u, 8v, and 8w, as in the cases of the fifth and sixth modified examples of the embodiment of the present invention.

While the embodiment of the present invention has been illustrated above with the case in which the GND pad 2 is arranged at the corner on the right side of the semiconductor substrate 1 as illustrated in FIG. 1, the arrangement position of the GND pad 2 is not limited to this case. For example, the GND pad 2 may be arranged at the corner on the left side of the semiconductor substrate 1, and the SET-side wire 21 may have a greater length than the RESET-side wire 22.

The embodiment of the present invention has been illustrated above with the case of using the Si substrate as the semiconductor substrate 1, but may also be applied to a case of using a semiconductor (a wide band-gap semiconductor) material having a wider band gap than Si, such as silicon carbide (SiC), gallium nitride (GaN), diamond, and aluminum nitride (AlN).

The semiconductor device according to the embodiment of the present invention has been illustrated above with the HVIC, but may be any other semiconductor device other than the HVIC. For example, the embodiment of the present invention is particularly effectively applied to a semiconductor device to which a high voltage of several tens of volts or greater is applied.

What is claimed is:

1. A semiconductor device comprising:
   a pad;
   a control circuit configured to operate at a first potential as a reference potential applied to the pad;
   a plurality of high-potential-side circuit regions having distances to the pad different from each other, each high-potential-side circuit region including a gate drive circuit configured to operate at a second potential that is a floating potential as a reference potential, a SET-side level shifter configured to convert a SET signal based on the first potential to a SET signal based on the second potential, and a RESET-side level shifter configured to convert a RESET signal based on the first potential to a RESET signal based on the second potential;
   a SET-side wire configured to electrically connect the pad with the SET-side level shifter of the high-potential-side circuit region located furthest from the pad; and
   a RESET-side wire configured to electrically connect the pad with the RESET-side level shifter of the high-potential-side circuit region located furthest from the pad; and
   wherein the SET-side level shifters of the high-potential-side circuit regions located closer to the pad than the high-potential-side circuit region located furthest from the pad are electrically connected to the pad via the SET-side wire, and
   the RESET-side level shifters of the high-potential-side circuit regions located closer to the pad than the high-potential-side circuit region located furthest from the pad are electrically connected to the pad via the RESET-side wire.

2. The semiconductor device of claim 1, wherein the SET-side wire and the RESET-side wire have lengths different from each other.

3. The semiconductor device of claim 1, wherein:
   the plural high-potential-side circuit regions each include a first wire electrically connected to the corresponding SET-side level shifter, and a second wire electrically connected to the corresponding RESET-side level shifter;
   the first wire of the high-potential-side circuit region located closer to the pad is electrically connected to the SET-side wire via the first wire of the high-potential-side circuit region located further from the pad; and the second wire of the high-potential-side circuit region located closer to the pad is electrically connected to the RESET-side wire via the second wire of the high-potential-side circuit region located further from the pad.

4. The semiconductor device of claim 3, further comprising:

a first connection wire configured to electrically connect the respective first wires of the different high-potential-side circuit regions to each other; and a second connection wire configured to electrically connect the respective second wires of the different high-potential-side circuit regions to each other.

5. The semiconductor device of claim 3, further comprising:

a first connection wire configured to electrically connect the respective first wires of the adjacent high-potential-side circuit regions to each other; and a second connection wire configured to electrically connect the respective second wires of the adjacent high-potential-side circuit regions to each other.

6. The semiconductor device of claim 5, wherein the first connection wire electrically connecting the respective first wires of the high-potential-side circuit regions is connected to the second connection wire electrically connecting the respective second wires of the same high-potential-side circuit regions.

7. The semiconductor device of claim 3, wherein the first wire and the second wire in each of the high-potential-side circuit regions are connected to each other.

8. The semiconductor device of claim 7, wherein the first wire and the second wire connected to each other is a circular wire arranged to surround the gate drive circuit.

9. The semiconductor device of claim 4, wherein the first connection wire and the second connection wire are arranged at a layer over the first wire and the second wire of each of the plural high-potential-side circuit regions.

10. The semiconductor device of claim 3, wherein the first wires of the adjacent high-potential-side circuit regions are separated from each other, and the second wires of the adjacent high-potential-side circuit regions are separated from each other.

11. The semiconductor device of claim 4, further comprising a VCC wire arranged at a layer under the first connection wire and the second connection wire, and electrically connected to a power supply of the control circuit.

12. The semiconductor device of claim 3, wherein the first wires of the adjacent high-potential-side circuit regions are directly connected to each other, and the second wires of the adjacent high-potential-side circuit regions are directly connected to each other.

13. A semiconductor device comprising:

a pad;

a control circuit configured to operate at a first potential as a reference potential applied to the pad;

a plurality of high-potential-side circuit regions having distances to the pad different from each other, each high-potential-side circuit region including a gate drive circuit configured to operate at a second potential that is a floating potential as a reference potential, a SET-side level shifter configured to convert a SET signal based on the first potential to a SET signal based on the second potential, a RESET-side level shifter configured to convert a RESET signal based on the first potential to a RESET signal based on the second potential, and a circular wire connected to the SET-side level shifter and the RESET-side level shifter;

a SET-side wire configured to electrically connect the pad with the respective SET-side level shifters of the plural high-potential-side circuit regions; and a RESET-side wire configured to electrically connect the pad with the respective RESET-side level shifters of the plural high-potential-side circuit regions, wherein the circular wire of the high-potential-side circuit region located closer to the pad is electrically connected to the SET-side wire and the RESET-side wire via the circular wire of the high-potential-side circuit region located further from the pad.

14. The semiconductor device of claim 13, wherein the SET-side wire and the RESET-side wire are arranged at a layer over the respective circular wires of the plural high-potential-side circuit regions, and are connected to the circular wire of the high-potential-side circuit region located furthest from the pad via a contact.

15. The semiconductor device of claim 13, wherein:

the SET-side wire and the RESET-side wire are arranged at a layer common to the respective circular wires of the plural high-potential-side circuit regions; and the semiconductor device further comprises a connection wire arranged at a layer over the SET-side wire and the RESET-side wire and configured to electrically connect the SET-side wire and the RESET-side wire with the circular wire of the high-potential-side circuit region located furthest from the pad.

16. The semiconductor device of claim 13, wherein the SET-side wire and the RESET-side wire are arranged at a layer common to the respective circular wires of the plural high-potential-side circuit regions, and are in direct contact with the circular wire of the high-potential-side circuit region located furthest from the pad.

* * * * *